United States Patent
Miyairi

(10) Patent No.: US 9,312,156 B2
(45) Date of Patent: Apr. 12, 2016

(54) THIN FILM TRANSISTOR

(75) Inventor: Hidekazu Miyairi, Kanagawa (JP)

(73) Assignee: SEMICONDUCTOR ENERGY LABORATORY CO., LTD., Kanagawa-ken (JP)

(*) Notice: Subject to any disclaimer, the term of this patent is extended or adjusted under 35 U.S.C. 154(b) by 923 days.

(21) Appl. No.: 12/726,040

(22) Filed: Mar. 17, 2010

(65) Prior Publication Data

US 2010/0244034 A1    Sep. 30, 2010

(30) Foreign Application Priority Data

Mar. 27, 2009  (JP) .................................. 2009-078763

(51) Int. Cl.
| | | |
|---|---|---|
| *H01L 29/786* | (2006.01) | |
| *H01L 21/67* | (2006.01) | |
| *H01L 27/12* | (2006.01) | |
| *H01L 29/04* | (2006.01) | |

(52) U.S. Cl.
CPC .......... *H01L 21/67207* (2013.01); *H01L 27/12* (2013.01); *H01L 29/04* (2013.01); *H01L 29/78618* (2013.01); *H01L 29/78696* (2013.01)

(58) Field of Classification Search
CPC . H01L 27/24; H01L 51/0545; H01L 27/1214; H01L 27/12; H01L 29/78696; H01L 21/67207; H01L 29/04; H01L 29/68618
USPC .......... 257/57, 59, E29.003, E29.414, 40, 64, 257/72, 213, 192, 327, 5, E29.117, E29.137
See application file for complete search history.

(56) References Cited

U.S. PATENT DOCUMENTS

| | | | |
|---|---|---|---|
| 4,409,134 A | | 10/1983 | Yamazaki |
| 5,416,340 A | * | 5/1995 | Yoshida et al. ................ 257/59 |
| 5,661,050 A | * | 8/1997 | den Boer et al. .............. 438/30 |
| 5,677,236 A | * | 10/1997 | Saitoh et al. .................. 438/485 |
| 5,962,896 A | * | 10/1999 | Yabuta et al. ................. 257/347 |
| 6,323,034 B1 | * | 11/2001 | Chen et al. ..................... 436/30 |
| 6,653,028 B2 | | 11/2003 | Lee et al. |
| 6,671,010 B2 | | 12/2003 | Kwon et al. |

(Continued)

FOREIGN PATENT DOCUMENTS

| | | |
|---|---|---|
| CN | 101369539 | 2/2009 |
| JP | 11-087717 A | 3/1999 |

(Continued)

OTHER PUBLICATIONS

Priority document—a file provided by the Examiner.*
Chinese Office Action, Application No. 201010155683.X, dated Nov. 4, 2013.

*Primary Examiner* — Galina Yushina
(74) *Attorney, Agent, or Firm* — Nixon Peabody LLP; Jeffrey L. Costellia

(57) ABSTRACT

A thin film transistor includes a gate electrode; a gate insulating layer which is provided to cover the gate electrode; a semiconductor layer which is provided over the gate insulating layer to overlap with the gate electrode; an impurity semiconductor layer which is partly provided over the semiconductor layer and which forms a source region and a drain region; and a wiring layer which is provided over the impurity semiconductor layer, where a width of the source region and the drain region is narrower than a width of the semiconductor layer, and where the width of the semiconductor layer is increased at least in a portion between the source region and the drain region.

20 Claims, 21 Drawing Sheets

(56) References Cited

U.S. PATENT DOCUMENTS

| | | |
|---|---|---|
| 6,724,444 B2 | 4/2004 | Ashizawa et al. |
| 6,897,482 B2 | 5/2005 | Morita et al. |
| 6,917,392 B2 | 7/2005 | Hannuki et al. |
| 7,161,212 B2 | 1/2007 | Ohishi et al. |
| 7,410,818 B2 | 8/2008 | Ohishi et al. |
| 7,611,930 B2 | 11/2009 | Yamazaki et al. |
| 2001/0040646 A1* | 11/2001 | Hannuki et al. ............... 349/43 |
| 2009/0002591 A1* | 1/2009 | Yamazaki et al. ............ 349/43 |
| 2009/0047758 A1* | 2/2009 | Yamazaki et al. ........... 438/158 |
| 2009/0321737 A1* | 12/2009 | Isa et al. ........................ 257/57 |

FOREIGN PATENT DOCUMENTS

| | | |
|---|---|---|
| JP | 2001-343669 A | 12/2001 |
| JP | 2002-055364 A | 2/2002 |
| JP | 2004-221207 A | 8/2004 |
| JP | 2005-228826 A | 8/2005 |
| JP | 2008-124392 A | 5/2008 |
| JP | 2009-044134 | 2/2009 |

* cited by examiner

THIN FILM TRANSISTOR

BACKGROUND OF THE INVENTION

1. Field of the Invention

The present invention relates to a thin film transistor. In particular, the present invention relates to a display device provided with a thin film transistor.

2. Description of the Related Art

In recent years, a thin film transistor (hereinafter referred to as a TFT) including a semiconductor thin film (with a thickness of several nanometers to several hundreds of nanometers, approximately) over a substrate having an insulating surface (e.g., a glass substrate) have been attracting attention. TFTs are widely used for IC (integrated circuit) and electronic devices such as electro-optical devices. In particular, a TFT is rapidly developed as a switching element of image display devices typified by liquid crystal display devices and the like. In an image display device such as a liquid crystal display device, a TFT including an amorphous semiconductor film or a TFT including a polycrystalline semiconductor film is mainly used as a switching element.

A TFT including an amorphous semiconductor film has low mobility. That is, current drive capability is low. Thus, there is a problem in that, when a protection circuit is formed using a TFT including an amorphous semiconductor film, a large-sized transistor should be formed as a countermeasure against electrostatic breakdown, which leads to hindrance to narrower frame parts. Further, there is also another problem in that parasitic capacitance between a scan line electrically connected to a gate electrode and a signal line electrically connected to a source electrode or a drain electrode may be increased when a large-sized transistor is formed, and thus power consumption may be increased.

On the other hand, a TFT including a polycrystalline semiconductor film has higher mobility than a TFT including an amorphous semiconductor film by two or more digits, and a pixel portion of a liquid crystal display device and peripheral driver circuits thereof can be formed over one substrate. A process of a TFT including a polycrystalline semiconductor film, however, is more complicated than that of a TFT including an amorphous semiconductor film, because of crystallization of a semiconductor film, introduction of an impurity element (doping), and the like. Therefore, there is a problem of a low yield and high cost. As a method for forming a polycrystalline semiconductor film, for example, a technique has widely been know in which the shape of a pulsed excimer laser beam is processed linearly by an optical system and an amorphous semiconductor film is irradiated with a linear laser beam while being scanned by the linear laser beam to be crystallized.

Note that as well as a TFT including an amorphous semiconductor film or a TFT including a polycrystalline semiconductor film, a TFT including a microcrystalline semiconductor film is known as a switching element of an image display device (for example, see Patent Document 1). However, there is difficulty in obtaining sufficient on current with a TFT including a microcrystalline semiconductor film. Therefore, in the TFT including an amorphous semiconductor film or a microcrystalline semiconductor film, various developments have been conducted to obtain sufficient on current.

REFERENCE

Patent Document

[Patent Document 1] Japanese Published Patent Application No. 2009-44134
[Patent Document 2] U.S. Pat. No. 4,409,134

SUMMARY OF THE INVENTION

An object of one embodiment of the present invention is to provide a TFT in which on current is larger and field-effect mobility is higher than those of the conventional TFTs.

Another embodiment of the present invention is a TFT in which an island width of a semiconductor layer between a source and a drain is increased.

The on current of the TFT can be increased sufficiently.
The field-effect mobility of the TFT can be increased sufficiently.

BRIEF DESCRIPTION OF THE DRAWINGS

In the accompanying drawings.

DETAILED DESCRIPTION OF THE INVENTION

Figure 1A:
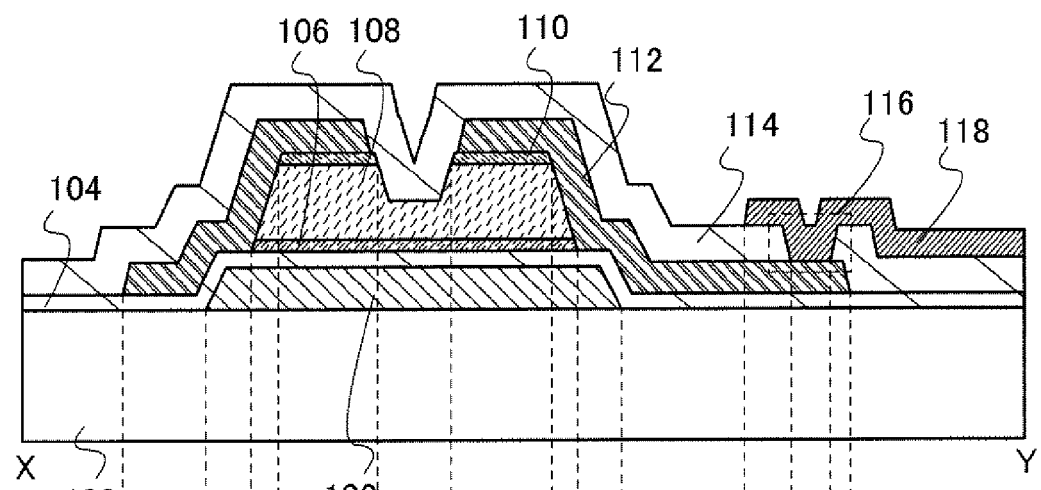
FIGS. 1A and 1B illustrate a TFT and a display device.

Embodiments of the present invention will be hereinafter described with reference to the accompanying drawings. However, the present invention is not limited to the following description, and it is easily understood by those skilled in the art that modes and details thereof can be modified in various ways without departing from the spirit and the scope of the present invention. Therefore, the present invention should not be interpreted as being limited to the description of the embodiments below. In description with reference to drawings, the same reference numerals denote in common the same portions in different drawings. Note that the same hatching pattern is applied to similar parts, and the similar parts are not especially denoted by reference numerals in some cases.

Embodiment 1

In this embodiment, a TFT according to one mode of the present invention will be described with reference to drawings.

According to one embodiment of the present invention, a thin film transistor includes a gate electrode; a gate insulating layer which is provided to cover the gate electrode; a semiconductor layer which is provided over the gate insulating layer to overlap with the gate electrode; an impurity semiconductor layer which is partly provided over the semiconductor layer and which forms a source region and a drain region; and a wiring layer which is provided over the impurity semiconductor layer, where a width of the source region and the drain region is narrower than a width of the semiconductor layer, and where the width of the semiconductor layer is increased at least in a portion between the source region and the drain region. Here, the gate electrode is formed using a first wiring layer, and source and drain electrodes are formed using a second wiring layer, and the same can be applied hereinafter.

According to another embodiment of the present invention, a thin film transistor includes a gate electrode; a gate insulating layer which is provided to cover the gate electrode; a semiconductor layer which is provided over the gate insulating layer to overlap with the gate electrode; an impurity semiconductor layer which is partly provided over the semiconductor layer and which forms a source region and a drain region; and a wiring layer which is provided over the impurity semiconductor layer, where a width of the source region and the drain region is narrower than a width of the semiconductor layer, and where the width of the semiconductor layer is increased only in a portion between the source region and the drain region.

According to another embodiment of the present invention, a thin film transistor includes a gate electrode; a gate insulating layer which is provided to cover the gate electrode; a semiconductor layer which is provided over the gate insulating layer to overlap with the gate electrode; an impurity semiconductor layer which is partly provided over the semiconductor layer and which forms a source region and a drain region; and a wiring layer which is provided over the impurity semiconductor layer, where a width of the source region and the drain region is narrower than a width of the semiconductor layer, where the width of the semiconductor layer is increased at least in a portion between the source region and the drain region, and where a length between the source region and the drain region is shorter than a length of a region where the semiconductor layer is increased.

According to another embodiment of the present invention, a display device includes a gate electrode; a gate insulating layer which is provided to cover the gate electrode; a semiconductor layer which is provided over the gate insulating layer to overlap with the gate electrode; an impurity semiconductor layer which is partly provided over the semiconductor layer and which forms a source region and a drain region; and a wiring layer which is provided over the impurity semiconductor layer, where a width of the source region and the drain region is narrower than a width of the semiconductor layer, where the width of the semiconductor layer is increased at least in a portion between the source region and the drain region, and where the wiring layer is provided over the source region and the drain region, and the wiring layer is connected to a pixel electrode layer which is selectively formed.

According to another embodiment of the present invention, a display device includes a gate electrode; a gate insulating layer which is provided to cover the gate electrode; a semiconductor layer which is provided over the gate insulating layer to overlap with the gate electrode; an impurity semiconductor layer which is partly provided over the semiconductor layer and which forms a source region and a drain region; and a wiring layer which is provided over the impurity semiconductor layer, where a width of the source region and the drain region is narrower than a width of the semiconductor layer, where the width of the semiconductor layer is increased only in a portion between the source region and the drain region, and where the wiring layer is provided over the source region and the drain region, and the wiring layer is connected to a pixel electrode layer which is selectively formed.

According to another embodiment of the present invention, a display device includes a gate electrode; a gate insulating layer which is provided to cover the gate electrode; a semiconductor layer which is provided over the gate insulating layer to overlap with the gate electrode; an impurity semiconductor layer which is partly provided over the semiconductor layer and which forms a source region and a drain region; and a wiring layer which is provided over the impurity semiconductor layer, where a width of the source region and the drain region is narrower than a width of the semiconductor layer, where the width of the semiconductor layer is increased at least in a portion between the source region and the drain region, where a length between the source region and the drain region is shorter than a length of a region where the semiconductor layer is increased, and where the wiring layer is provided over the source region and the drain region, and the wiring layer is connected to a pixel electrode layer which is selectively formed.

Figure 1B:
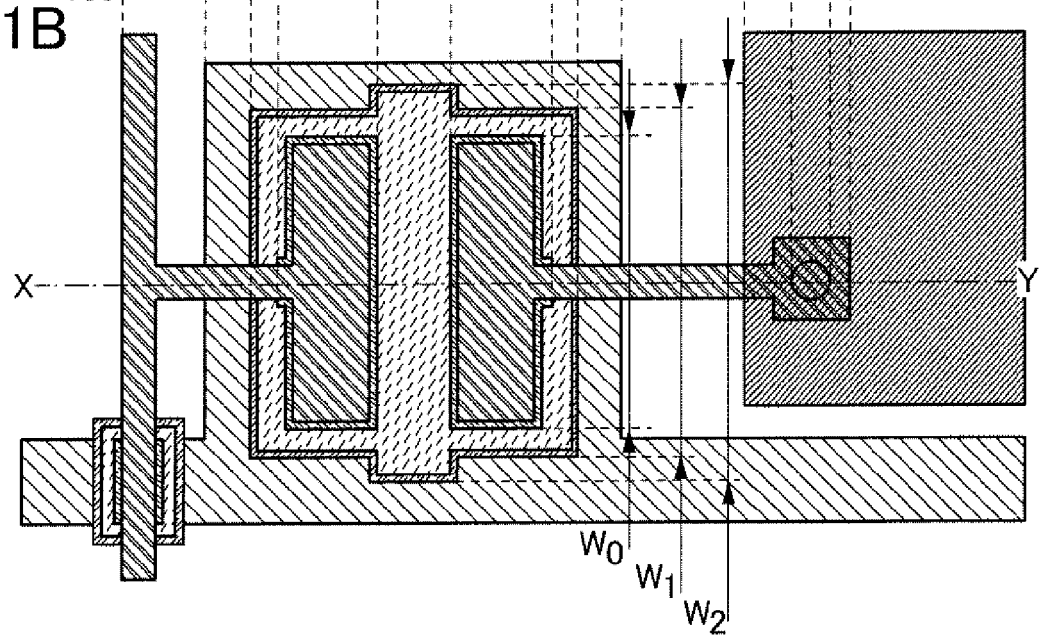

FIGS. 1A and 1B illustrate an example of a TFT of this embodiment. FIG. 1A illustrates a cross-sectional view, and FIG. 1B illustrates a top view. Note that FIG. 1A is a cross-sectional view taken along line X-Y illustrated in FIG. 1B.

In the TFT illustrated in FIGS. 1A and 1B, a gate insulating layer 104 is provided to cover a first wiring layer 102 over a substrate 100, a first semiconductor layer 106 is provided over the gate insulating layer 104, a second semiconductor layer 108 is provided over the first semiconductor layer 106, and second wiring layers 112 are provided over the second semiconductor layer 108 with impurity semiconductor layers 110 interposed therebetween (see FIG. 1A). Here, the impurity semiconductor layers 110 are provided to obtain ohmic contact between the second semiconductor layer 108 and the second wiring layers 112. The second wiring layers 112 form a source electrode, a drain electrode, and a source wiring. Note that the TFT is preferably covered with a protective layer 114. In the case of using the TFT as a pixel transistor of a display device, an opening 116 may be provided in the protective layer 114, and a pixel electrode layer 118 may be provided so as to be connected to the second wiring layer 112 through the opening 116, as illustrated in FIGS. 1A and 1B.

The substrate 100 is not limited to a substrate formed using a particular material as long as it has heat resistance, chemical resistance, and the like enough to withstand a step of forming a thin film (crystalline silicon, or the like) which is to be formed over the substrate 100. Specifically, a glass substrate, a quartz substrate, a stainless steel substrate, and a silicon substrate can be given. Note that as illustrated in FIGS. 1A and 1B, in the case of applying the TFT to a display device, a light-transmitting substrate such as a glass substrate or a quartz substrate may be used as the substrate 100. When the substrate 100 is a mother glass, the substrate may have any size of the first generation (e.g., 320 mm×400 mm) to the tenth generation (e.g., 2950 mm×3400 mm); however, the substrate is not limited thereto.

The first wiring layer 102, which can be formed using a conductive material, may be a single layer or a plurality of layers stacked. For example, the first wiring layer 102 can be formed using a metal material such as Mo, Ti, Cr, Ta, W, Al, Cu, Nd, or Sc or an alloy material which includes any of these materials as a main component. Note that the first wiring layer 102 forms at least a gate electrode and a gate wiring.

The gate insulating layer 104, which can be formed using an insulating material, may be a single layer or a plurality of layers stacked. For example, the gate insulating layer 104 can be formed using silicon oxide, silicon nitride, silicon oxynitride, or silicon nitride oxide. When the first semiconductor layer 106 is a crystalline semiconductor layer, at least the gate insulating layer 104 which is in contact with the first semiconductor layer 106 is preferably formed using a silicon oxide layer. In the case where a silicon oxide layer is formed as the gate insulating layer 104, the gate insulating layer 104 is preferably formed using a silicon oxide layer including tetraethoxysilane (TEOS) $(Si(OC_2H_5)_4)$ as a source gas.

Note that silicon oxynitride contains more oxygen than nitrogen and, in the case where measurements are performed using Rutherford backscattering spectrometry (RBS) and hydrogen forward scattering (HFS), silicon oxynitride contains oxygen, nitrogen, silicon, and hydrogen as composition ranging from 50 atomic % to 70 atomic %, 0.5 atomic % to 15 atomic %, 25 atomic % to 35 atomic %, and 0.1 atomic % to 10 atomic %, respectively.

Note that silicon nitride oxide contains more nitrogen than oxygen and, in the case where measurements are performed using RBS and HFS, silicon nitride oxide contains oxygen, nitrogen, silicon, and hydrogen as composition ranging from 5 atomic % to 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms contained in the silicon oxynitride or the silicon nitride oxide is defined as 100 atomic %.

The first semiconductor layer 106 is preferably formed using a crystalline semiconductor. The crystalline semiconductor includes a polycrystalline semiconductor, a microcrystalline semiconductor, and the like. The first semiconductor layer 106 is preferably formed using a microcrystalline semiconductor which does not need a crystallization step.

Here, a microcrystalline semiconductor is a semiconductor having an intermediate structure between amorphous and crystalline structures (including a single crystal structure and a polycrystalline structure). A microcrystalline semiconductor is a semiconductor having a third state that is stable in terms of free energy and a crystalline semiconductor having short-range order and lattice distortion, in which columnar or needle-like crystals having a grain size of 2 nm to 200 nm inclusive, preferably 10 nm to 80 nm inclusive, more preferably 20 nm to 50 nm inclusive have grown in a direction normal to the substrate surface. Therefore, in some cases, a crystal grain boundary is formed at the interface of the columnar or needle-like crystals.

Microcrystalline silicon which is one of microcrystalline semiconductors has a peak of Raman spectrum which is shifted to a lower wavenumber side than 520 $cm^{-1}$ that represents single crystal silicon. In other words, the peak of the Raman spectrum of the microcrystalline silicon is between 520 $cm^{-1}$ which represents single crystal silicon and 480 $cm^{-1}$ which represents amorphous silicon. Further, microcrystalline silicon includes hydrogen or halogen of at least 1 atomic % or more for termination of dangling bonds. Moreover, microcrystalline silicon contains a rare gas element such as He, Ar, Kr, or Ne to further promote lattice distortion, so that stability is increased and a favorable microcrystalline semiconductor can be obtained. Such a microcrystalline semiconductor is disclosed in, for example, U.S. Pat. No. 4,409,134.

Moreover, when the concentration of oxygen and nitrogen included in the first semiconductor layer 106 (a value measured by secondary ion mass spectrometry) is less than $1 \times 10^{18}$ $cm^{-3}$, the crystallinity of the first semiconductor layer 106 can be improved.

The second semiconductor layer 108 is provided in contact with the first semiconductor layer 106 and is preferably formed using a material with carrier mobility lower than that of the first semiconductor layer 106. The off current can be reduced with the second semiconductor layer 108.

For example, a crystalline semiconductor layer is preferably formed as the first semiconductor layer 106 and a semiconductor layer containing an amorphous semiconductor and a minute semiconductor crystal grain is preferably formed as the second semiconductor layer 108. When the TFT is turned on, current flows mainly through the first semiconductor layer 106. When the TFT is turned off, current flows mainly through the second semiconductor layer 108. Further, a "semiconductor layer containing an amorphous semiconductor and a minute semiconductor crystal grain" is formed as the second semiconductor layer 108, whereby reduction in on current can also be prevented. Accordingly, a crystalline semiconductor layer is formed as the first semiconductor layer 106 and a "semiconductor layer containing an amorphous semiconductor and a minute semiconductor crystal grain" is formed as the second semiconductor layer 108, whereby a TFT having a high on/off ratio can be obtained.

The above-described "semiconductor layer containing an amorphous semiconductor and a minute semiconductor crystal grain" which is one of preferable modes of the second semiconductor layer 108 has an amorphous semiconductor and a minute semiconductor crystal grain, and has lower energy at an Urbach edge measured by a constant photocurrent method (CPM) or photoluminescence spectroscopy and a smaller amount of absorption spectra of defects, as compared to a conventional amorphous semiconductor. That is, as compared to the conventional amorphous semiconductor, such a semiconductor layer is a well-ordered semiconductor layer which has fewer defects and whose tail slope of a level at a band edge (a mobility edge) in the valence band is steep.

Note that the second semiconductor layer 108 is not limited to the above description and may be formed using an amorphous semiconductor. The second semiconductor layer 108 may be formed using an amorphous semiconductor, an amorphous semiconductor having halogen, or an amorphous semiconductor having nitrogen as long as a material with carrier mobility at least lower than that of the first semiconductor layer 106 is used. As the amorphous semiconductor, amorphous silicon can be given.

An interface region between the first semiconductor layer 106 and the second semiconductor layer 108 preferably has microcrystalline semiconductor regions and an amorphous semiconductor filling the space between the microcrystalline semiconductor regions. Specifically, the interface region between the first semiconductor layer 106 and the second semiconductor layer 108 includes a microcrystalline semiconductor region which extends in a convex shape from the first semiconductor layer 106 and a semiconductor similar to that used in the second semiconductor layer 108. At this time, since the interface region between the first semiconductor layer 106 and the second semiconductor layer 108 has conical or pyramidal microcrystalline semiconductor regions, resistance of the vertical direction (the film thickness direction) at the time when voltage is applied to the second wiring layers 112 (that is, resistance between the second semiconductor layer 108 and a source region or a drain region formed using the impurity semiconductor layers 110) can be lowered, whereby on current of the TFT can be increased. Note that the interface region here refers to a region adjacent to the interface in the film thickness direction.

Most of the interface region between the first semiconductor layer 106 and the second semiconductor layer 108 preferably includes a crystal grain having a convex shape whose top gets narrower from the gate insulating layer 104 toward the second semiconductor layer 108. Alternatively, the most of the interface region between the first semiconductor layer 106 and the second semiconductor layer 108 may include a crystal grain having a convex shape whose top gets wider from the gate insulating layer 104 toward the second semiconductor layer 108.

When the microcrystalline semiconductor region includes a crystal grain having a convex shape whose top gets narrower from the gate insulating layer 104 toward the second semiconductor layer 108 in the interface region between the first semiconductor layer 106 and the second semiconductor layer 108, a proportion of the microcrystalline semiconductor region on the first semiconductor layer 106 side is higher than that on the second semiconductor layer 108 side. The microcrystalline semiconductor region grows from a surface of the first semiconductor layer 106 in the film thickness direction. When the flow ratio of hydrogen to silane in a source gas is reduced or the concentration of the source gas containing nitrogen is increased, crystal growth of the microcrystalline semiconductor region is suppressed, and thus, a crystal grain comes to have a conical or pyramidal shape, and a large part of a semiconductor which is formed by deposition becomes amorphous.

The second semiconductor layer 108 functions as a layer which relieves an electric field and thus reduces off current. Here, the case will be described in which the second semiconductor layer 108 is formed by processing a well-ordered semiconductor which has fewer defects and whose tail of a level at a band edge (mobility edge) in the valence band is steeper as compared to the conventional amorphous semiconductor. Such a semiconductor film is formed so that the crystal growth is suppressed in such a manner that a gas containing nitrogen is preferably mixed in a source gas for forming a crystalline semiconductor film, the flow rate of hydrogen with respect to a deposition gas (e.g., a silane gas) is reduced as compared to a deposition condition of the crystalline semiconductor film, and a plasma CVD method is used. It is preferable that nitrogen be contained at $1 \times 10^{20}$ cm$^{-3}$ to $1 \times 10^{21}$ cm$^{-3}$ in the second semiconductor layer 108. Here, nitrogen is preferably in a state of an NH group or an NH$_2$ group. This is because dangling bonds of a semiconductor atom are cross-linked with a nitrogen atom or an NH group or terminated with an NH$_2$ group, and thus carriers flow easily. In particular, the dangling bonds of two adjacent silicon atoms are cross-linked with an NH group, whereby carrier mobility is improved and thus on current is increased. Note that the NH$_2$ group mainly contributes to terminating dangling bonds in the semiconductor film. As a result, the density of trap levels due to crystal grain boundaries or defects can be reduced, and the potential barrier can be made to disappear or reduced. Therefore, carriers are not scattered, trapped, or recombined easily, whereby carrier mobility is improved and thus the TFT can obtain sufficient field-effect mobility and on current.

Further, the dangling bonds are cross-linked with a nitrogen atom or an NH group, or terminated with an NH$_2$ group, whereby the trap level which is formed in the vicinity of the center of the semiconductor band gap disappears or the number thereof decreases. Accordingly, indirect tunneling current (e.g., Shockley Read Hall current, Trap assisted tunneling current, or Poole Frenkel current) which is due to this trap level can be suppressed and thus off current can also be reduced.

The above-described second semiconductor layer 108 is provided, whereby a TFT having a high on/off ratio can be obtained. Note that the flow rate of the dilution gas is 10 times to 2000 times, inclusive, preferably 50 times to 200 times, inclusive, that of the deposition gas, and the flow rate ratio of the dilution gas is preferably set smaller than that in the case of forming a crystalline semiconductor film.

Further, the concentration of oxygen in the above interface region is reduced, whereby defects and bonding that inhibits carrier from transferring at the interface between the microcrystalline semiconductor region and the amorphous semiconductor region or the interface between the crystal grains can be reduced.

Alternatively, without limitation to the above description, a structure without the second semiconductor layer 108 may be employed. In this case, the above interface region is preferably provided between the first semiconductor layer 106 and the impurity semiconductor layers 110. The interface region has microcrystalline semiconductor regions and an amorphous semiconductor region filling the space except the microcrystalline semiconductor regions. The microcrystalline semiconductor region is formed using a microcrystalline semiconductor which extends from the first semiconductor layer 106. At this time, it is preferable that the proportion of the microcrystalline semiconductor region to the amorphous semiconductor region be small. It is further preferable that the proportion of the microcrystalline semiconductor region be small in a region between a pair of the impurity semiconductor layers 110 (between the source region and the drain region), that is, a region where carriers flow. This is because off current of the TFT can be reduced. Further, since resistance of the vertical direction (the film thickness direction) when voltage is applied to the second wiring layers 112 is low in the above interface region, on current of the TFT can be increased.

The impurity semiconductor layers 110 are provided in order that the first semiconductor layer 106 or the second semiconductor layer 108, and the second wiring layers 112 have ohmic contact with each other, and can be formed adding a gas containing an impurity element imparting one conductivity type to a source gas. In the case of forming a TFT having n-type conductivity, for example, phosphorus may be added as the impurity element, and a gas containing an impurity element imparting n-type conductivity, such as phosphine, may be added to silicon hydride. In the case of forming a TFT having p-type conductivity, for example, boron may be added as an impurity element, and a gas containing an impurity element imparting p-type conductivity, such as diborane, may be added to silicon hydride. Note that there is no particular limitation on the crystallinity of the impurity semiconductor layers 110. The impurity semiconductor layers 110 may be formed using either a crystalline semiconductor or an amorphous semiconductor, but preferably formed using a crystalline semiconductor. This is because on current is increased when the impurity semiconductor layers 110 are formed using a crystalline semiconductor layer.

The second wiring layers 112, which are formed using a conductive material, may be a single layer or a plurality of layers stacked. For example, the second wiring layers 112 can be formed using a material similar to that of the first wiring layer 102.

The protective layer 114 can be formed in a manner similar to that of the gate insulating layer 104 and is preferably formed using silicon nitride. In particular, a dense silicon nitride layer is preferably used as the protective layer 114 such that entry of a substance capable of being a contaminant substance such as an organic substance, a metal, or moisture contained in the atmosphere can be prevented.

The pixel electrode layer 118 can be formed using a conductive composition containing a conductive macromolecule (also referred to as a conductive polymer) having a light-transmitting property. As a conductive macromolecule, a so-called π electron conjugated conductive macromolecule can be used. For example, polyaniline or a derivative thereof, polypyrrole or a derivative thereof, polythiophene or a derivative thereof, and a copolymer of two or more kinds of those materials can be given.

Alternatively, the pixel electrode layer 118 may be formed using, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Note that in an intersecting portion of a scan line connected to the first wiring layer 102 and a signal line connected to the second wiring layers 112 of the TFT illustrated in FIGS. 1A and 1B, the first semiconductor layer 106, the second semiconductor layer 108 (hereinafter, the first semiconductor layer 106 or the second semiconductor layer 108 is also simply referred to as the semiconductor layer), and the impurity semiconductor layer 110 are provided between the scan line and the signal line; therefore, parasitic capacitance generated between the scan line and the signal line can be reduced. Here, it is preferable that at least the first semiconductor layer 106 which is provided between the scan line and the signal line be provided so as to protrude from the overlapping scan line, whereby parasitic capacitance generated between the scan line and the signal line can be further reduced.

Next, the TFT illustrated in FIGS. 1A and 1B, and TFTs illustrated in FIGS. 2A and 2B, FIGS. 3A and 3B, FIGS. 4A and 4B, FIGS. 5A and 5B, and FIGS. 6A and 6B are compared. In the TFT illustrated in FIGS. 1A and 1B, the width of the source region and the drain region is referred to as a source/drain width $W_0$, the inside width of the semiconductor layer is referred to as a minimum island width $W_1$, and the outside width of the semiconductor layer is referred to as a maximum island width $W_2$ ($W_0 < W_1 < W_2$). A channel formation region is thus increased between the source region and the drain region, whereby, in the TFT, the field-effect mobility can be improved and thus on current can be increased.

Figure 2A:
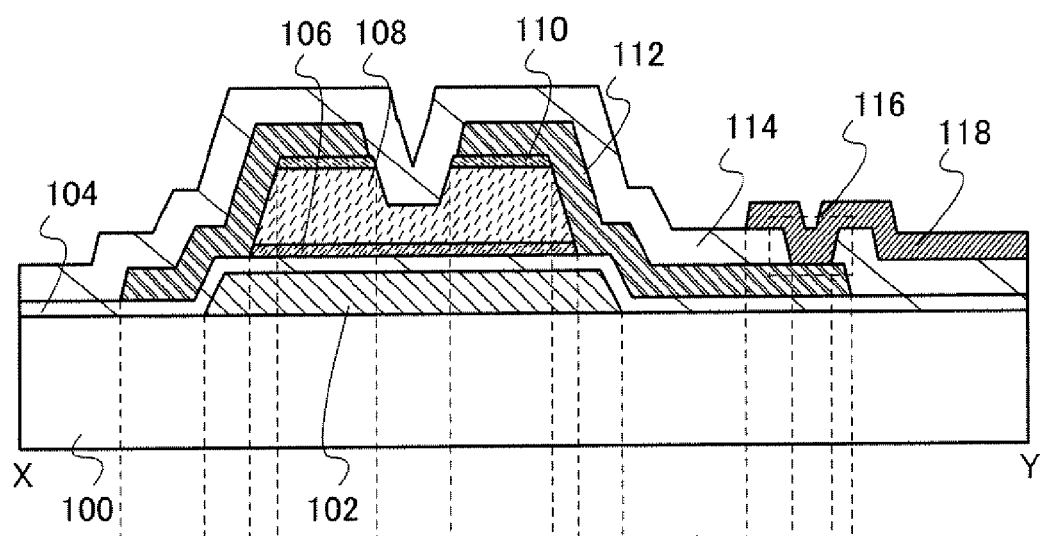
FIGS. 2A and 2B illustrate a TFT and a display device.
Figure 2B:
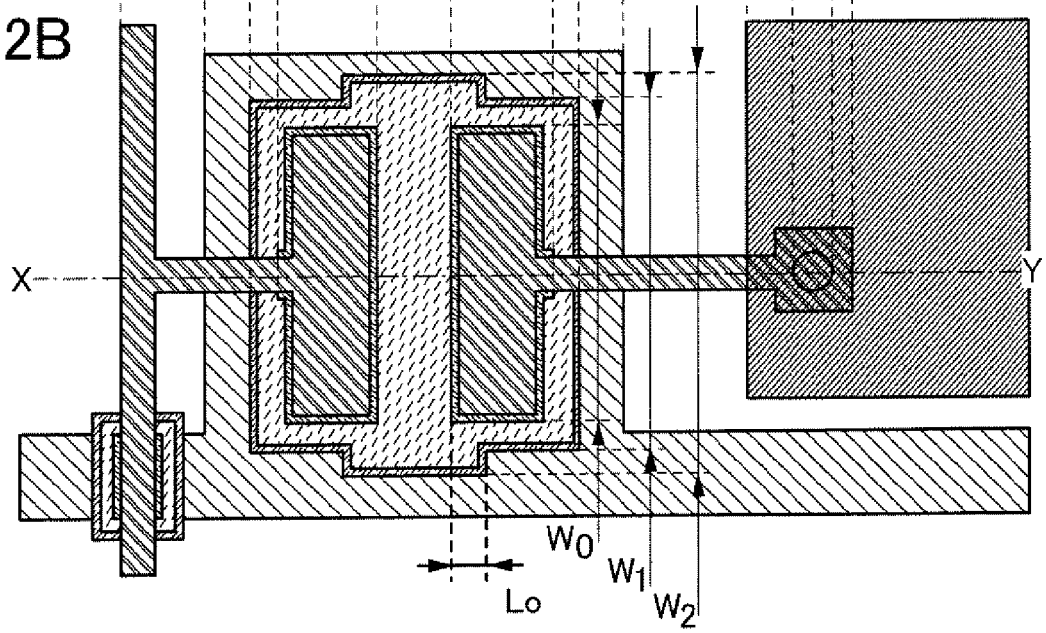

In the semiconductor layer of the TFT illustrated in FIGS. 1A and 1B, the channel formation region is enlarged only in a portion between the source region and the drain region; however, in the TFT illustrated in FIGS. 2A and 2B, the enlarged portion of the semiconductor layer is extended also in a channel length direction. This overlapping portion is referred to as an offset region, and the length of the offset region in a channel length direction is denoted by $L_0$. In other words, in the TFT illustrated in FIGS. 2A and 2B, the enlarged portion of the semiconductor layer is extended also in a channel length direction by 2 $L_0$ as compared to the TFT illustrated in FIGS. 1A and 1B.

Figure 5A:
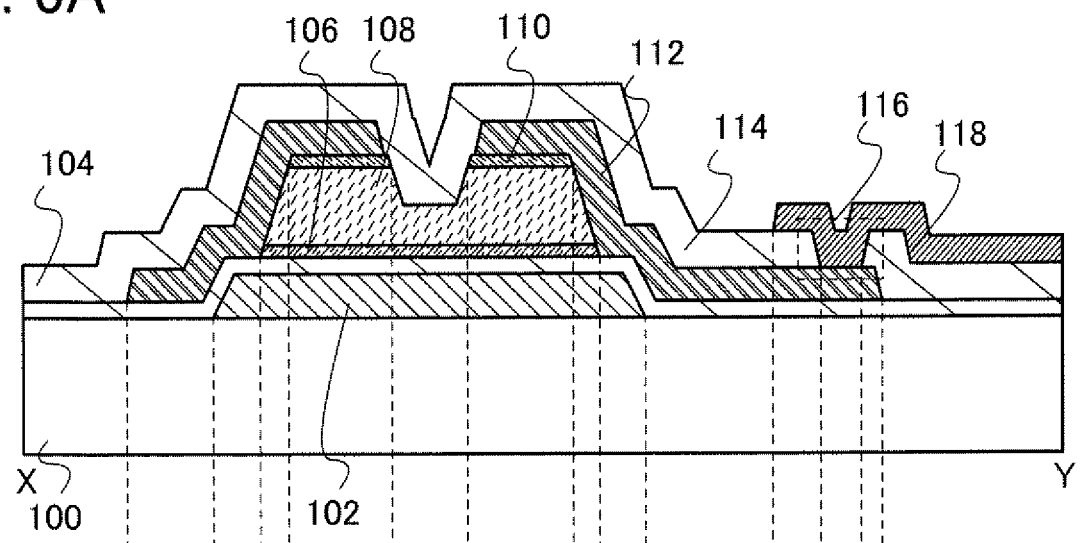
FIGS. 5A and 5B illustrate a TFT and a display device.
Figure 5B:
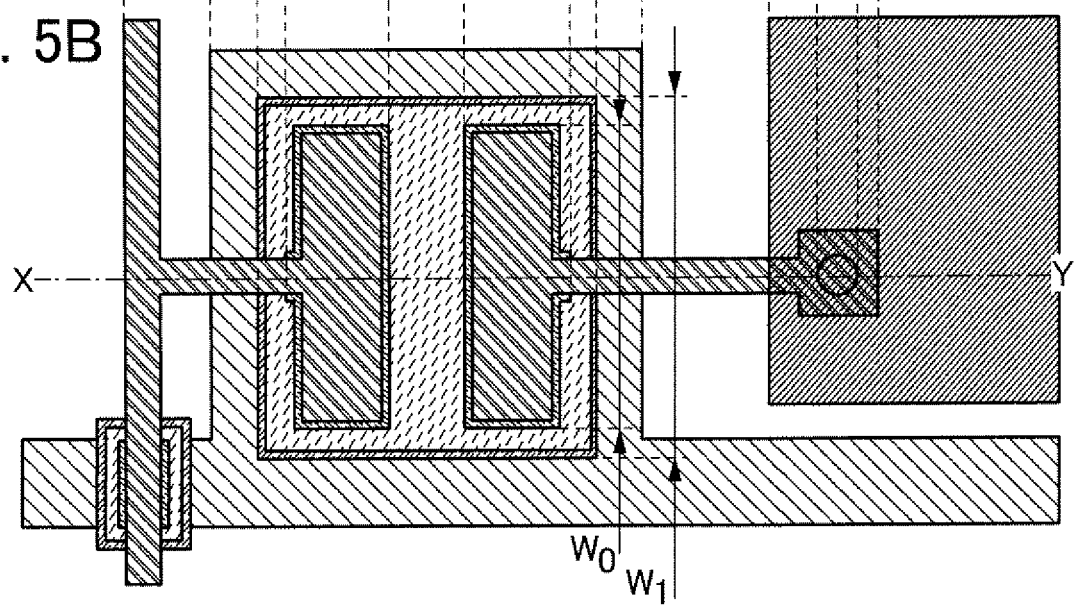

The TFT illustrated in FIGS. 1A and 1B and the TFT illustrated in FIGS. 2A and 2B each have higher field-effect mobility and larger on current than the TFT having a minimum island width $W_1$ which is illustrated in FIGS. 5A and 5B.

Note that when on currents of the TFTs illustrated in FIGS. 1A and 1B, FIGS. 2A and 2B, and FIGS. 5A and 5B are calculated, the TFT illustrated in FIGS. 2A and 2B has the largest on current, whereas the TFT illustrated in FIGS. 5A and 5B has the smallest on current.

Here, the current density distribution in the TFT where the enlarged portion of the semiconductor layer is extended also in a channel length direction was calculated. Now, a gate voltage was 15 V, and a drain voltage was 10 V. Changes in current density distribution with respect to changes in the length of the offset region in a channel length direction $L_0$ were examined with the semiconductor layer having the following size: the length in a channel length direction was 50 µm; and for the lengths in a direction perpendicular to the channel length, the length of the source/drain width $W_0$ was 10 µm, the length of the minimum island width $W_1$ was 20 µm, and the length of the maximum island width $W_2$ was 30 µm. Note that for simplification, here, the calculation was performed on the assumption that the first semiconductor layer 106 and the second semiconductor layer 108 are provided using a single amorphous semiconductor layer.

Note that the gate voltage refers to a potential difference between a potential of a source electrode and a potential of a gate electrode; and the drain voltage refers to a potential difference between the potential of the source electrode and a potential of a drain electrode. Here, the potential of the source electrode is used as the reference in the gate voltage and the drain voltage.

Figure 8:
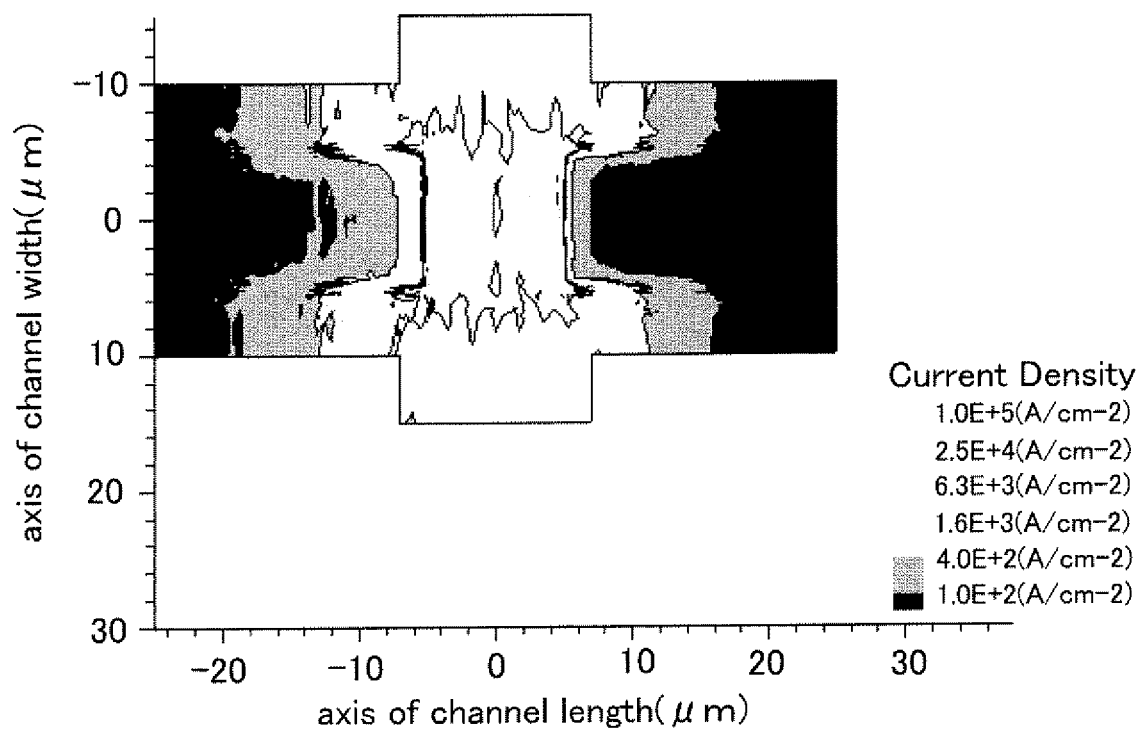
FIG. 8 is a graph showing calculation results.
Figure 9:
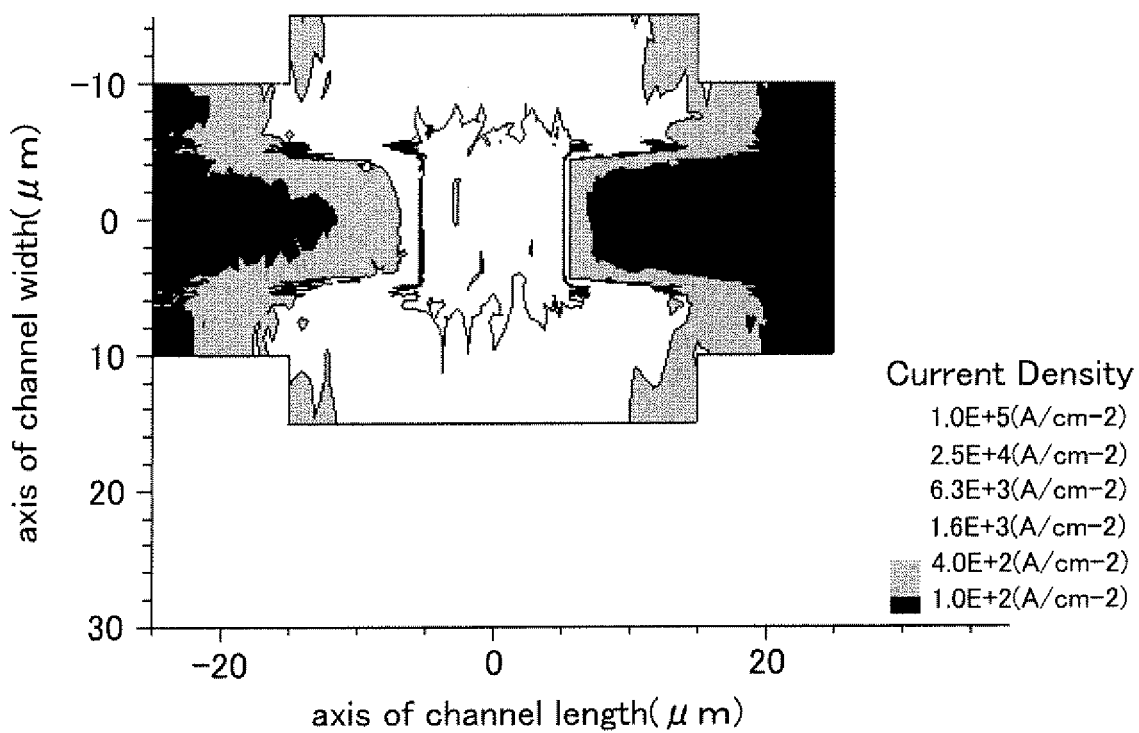
FIG. 9 is a graph showing calculation results.
Figure 10:
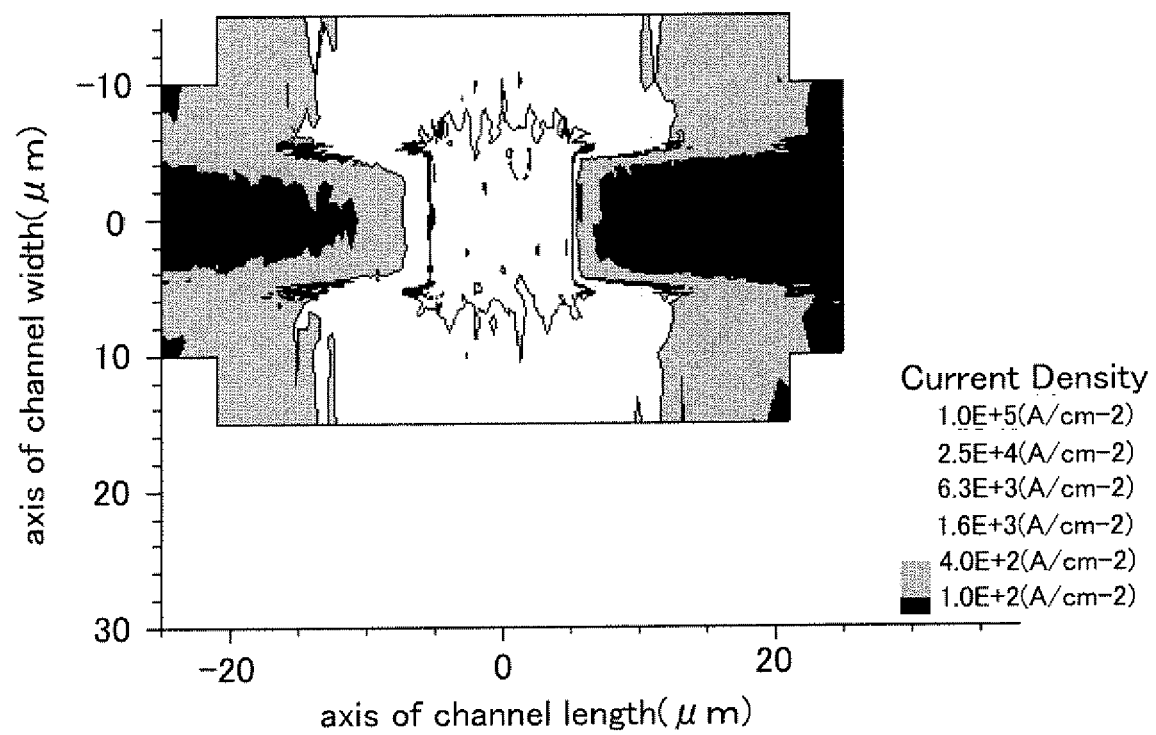
FIG. 10 is a graph showing calculation results.

FIG. 8 shows current density distribution in the case where the length of the offset region in a channel length direction $L_0$ is approximately 2 µm. FIG. 9 shows current density distribution in the case where the length of the offset region in a channel length direction $L_0$ is approximately 10 µm. FIG. 10 shows current density distribution in the case where the length of the offset region in a channel length direction $L_0$ is approximately 16 µm. In FIG. 8, the length of the offset region in a channel length direction $L_0$ is short and a region having high current density is extended as far as the vicinity of the outer edge of the semiconductor layer; therefore, a region where current can enter and pass through sufficiently cannot be secured. On the other hand, in FIG. 10, since current does not flow in the vicinity of the outer edge of the semiconductor layer, this region cannot be used enough. Therefore, it can be said that the TFT illustrated in FIG. 9 is optimal. In other words, almost half of the semiconductor layer in a channel length direction is preferably enlarged.

Figure 7A:
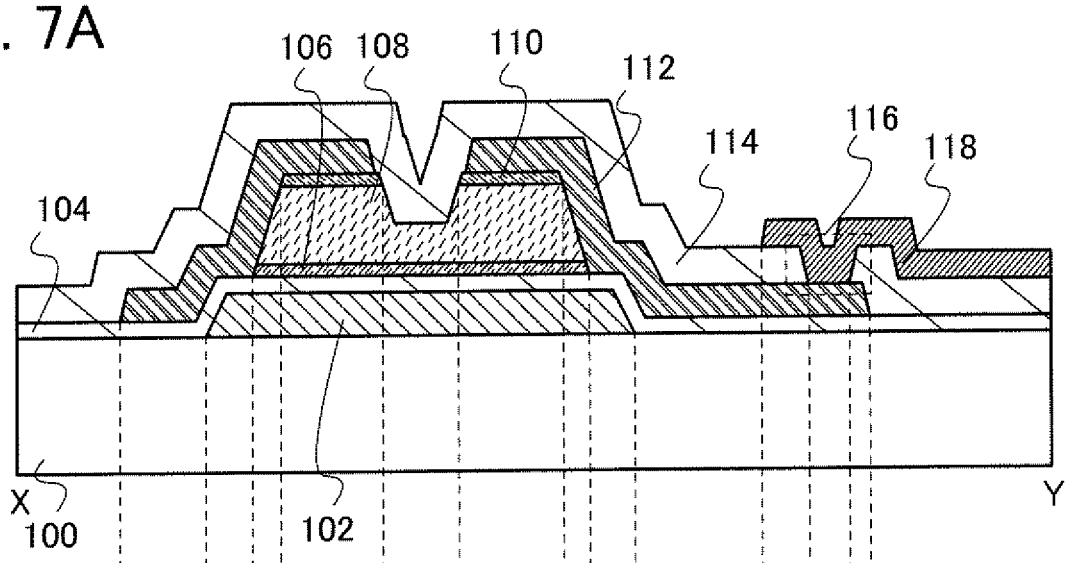
FIGS. 7A and 7B illustrate a TFT and a display device.
Figure 7B:
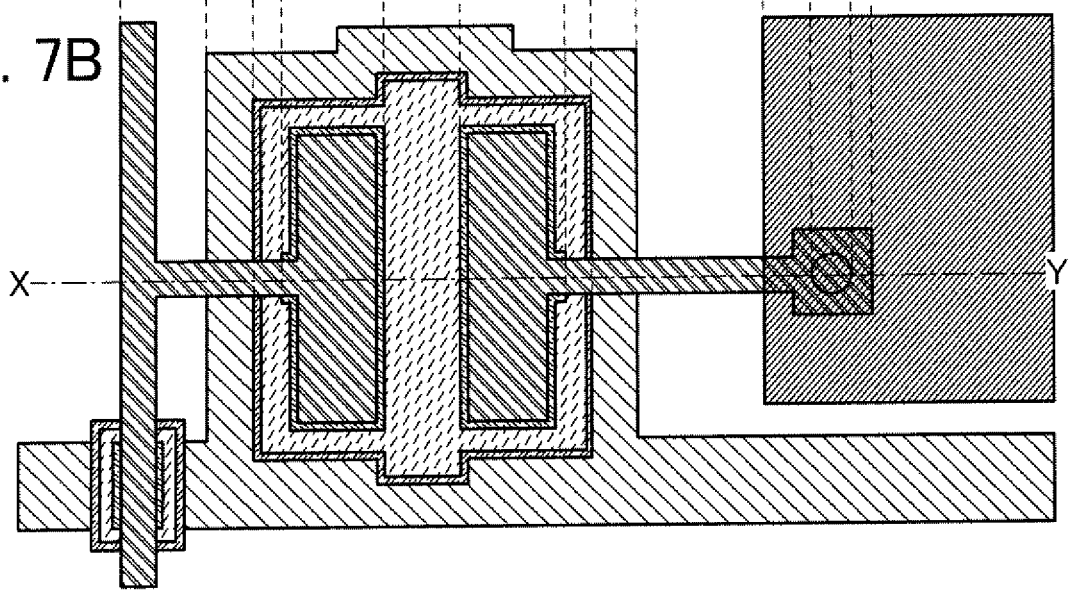

Note that as illustrated in FIGS. 7A and 7B, the shape of the gate electrode in the top view is processed in accordance with the shape of the semiconductor layer, whereby an aperture ratio can be improved.

Note that since part (a side surface) of the second semiconductor layer and the wiring layer are in contact with each other in each of the TFTs illustrated in FIGS. 1A and 1B, FIGS. 2A and 2B, and FIGS. 5A and 5B, this contact portion might cause increase in off current. Therefore, the portion where the wiring layer is at least in contact with the second semiconductor layer is preferably formed using a material having a low work function, in particular, yttria, titanium, or titanium nitride.

Note that in each of the TFTs illustrated in FIGS. 1A and 1B, FIGS. 2A and 2B, and FIGS. 5A and 5B, the entire surface of the semiconductor layer overlaps with the gate electrode so as to be shielded from light; therefore, an influence of a photocurrent is small. However, without limitation thereto, it is not always necessary for the entire surface of the semiconductor layer to overlap with the gate electrode as illustrated in FIGS. 3A and 3B, FIGS. 4A and 4B, and FIGS. 6A and 6B.

Figure 3A:
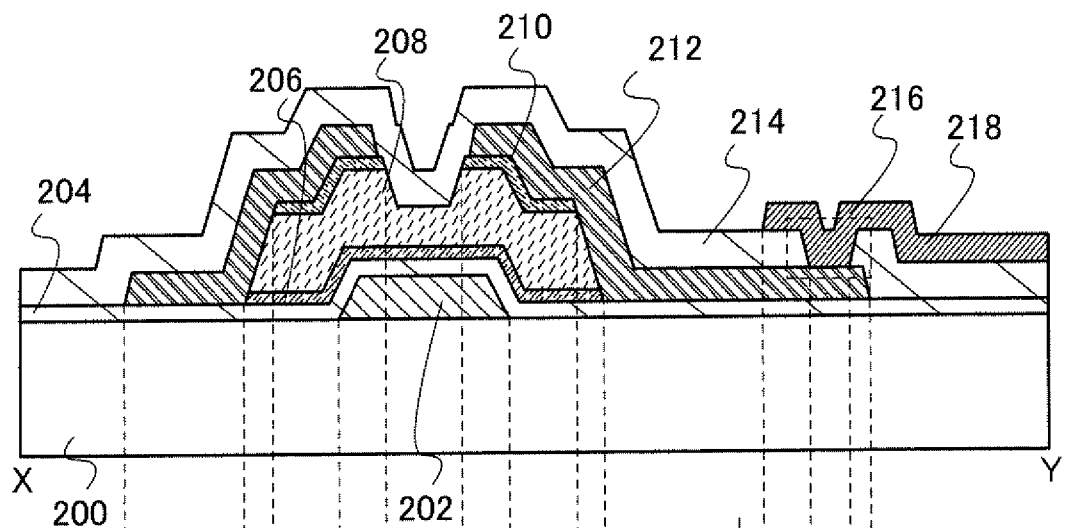
FIGS. 3A and 3B illustrate a TFT and a display device.
Figure 3B:
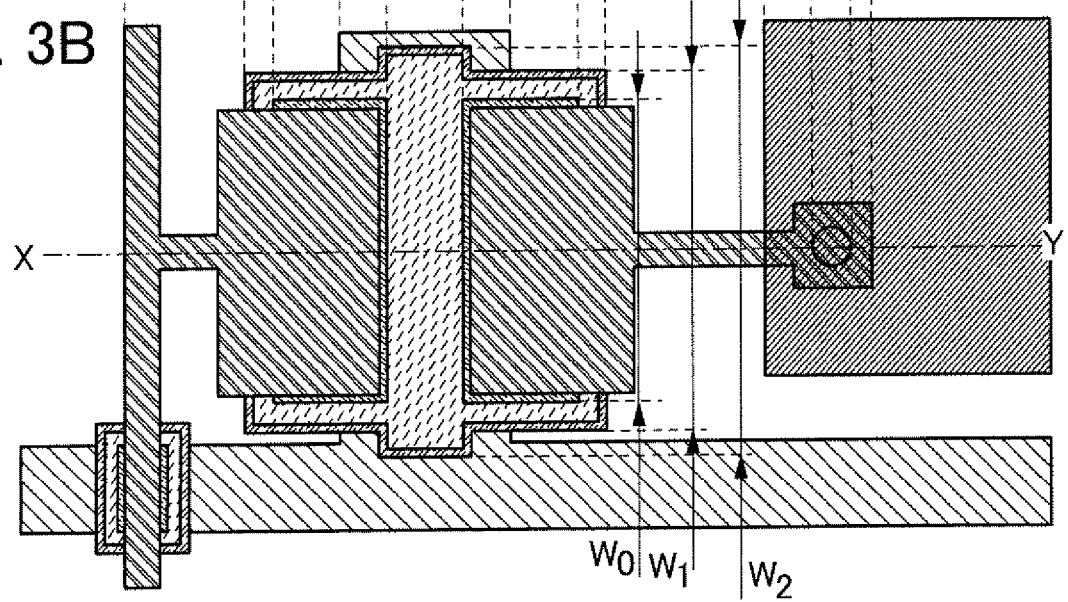

A TFT illustrated in FIGS. 3A and 3B includes the following over a substrate 200: a first wiring layer 202; a first semiconductor layer 206; a second semiconductor layer 208; a gate insulating layer 204 which is provided between and in contact with the first wiring layer 202 and the first semiconductor layer 206; impurity semiconductor layers 210 which are provided in contact with the second semiconductor layer 208; and second wiring layers 212 partly in contact with the impurity semiconductor layers 210 and the second semiconductor layer 208, in which the gate electrode formed using the first wiring layer 202 overlaps with part of the semiconductor layer. Further, in a manner similar to that of FIGS. 1A and 1B, a mode is illustrated in which the TFT is covered with a protective layer 214 and a pixel electrode layer 218 is provided so as to be connected to the second wiring layers 212 through an opening 216 formed in the protective layer 214. The second semiconductor layer 208 is provided in contact with the first semiconductor layer 206 and is preferably formed using a material with carrier mobility lower than that of the first semiconductor layer 206.

Note that the substrate 200 corresponds to the substrate 100 in FIGS. 1A and 1B. The first wiring layer 202 corresponds to the first wiring layer 102 in FIGS. 1A and 1B. The gate insulating layer 204 corresponds to the gate insulating layer 104 in FIGS. 1A and 1B. The first semiconductor layer 206 corresponds to the first semiconductor layer 106 in FIGS. 1A and 1B. The second semiconductor layer 208 corresponds to the second semiconductor layer 108 in FIGS. 1A and 1B. The impurity semiconductor layers 210 correspond to the impurity semiconductor layers 110 in FIGS. 1A and 1B. The second wiring layers 212 correspond to the second wiring layers 112 in FIGS. 1A and 1B. The protective layer 214 corresponds to the protective layer 114 in FIGS. 1A and 1B. The opening 216 corresponds to the opening 116 in FIGS. 1A and 1B. The pixel electrode layer 218 corresponds to the pixel electrode layer 118 in FIGS. 1A and 1B.

Figure 4A:
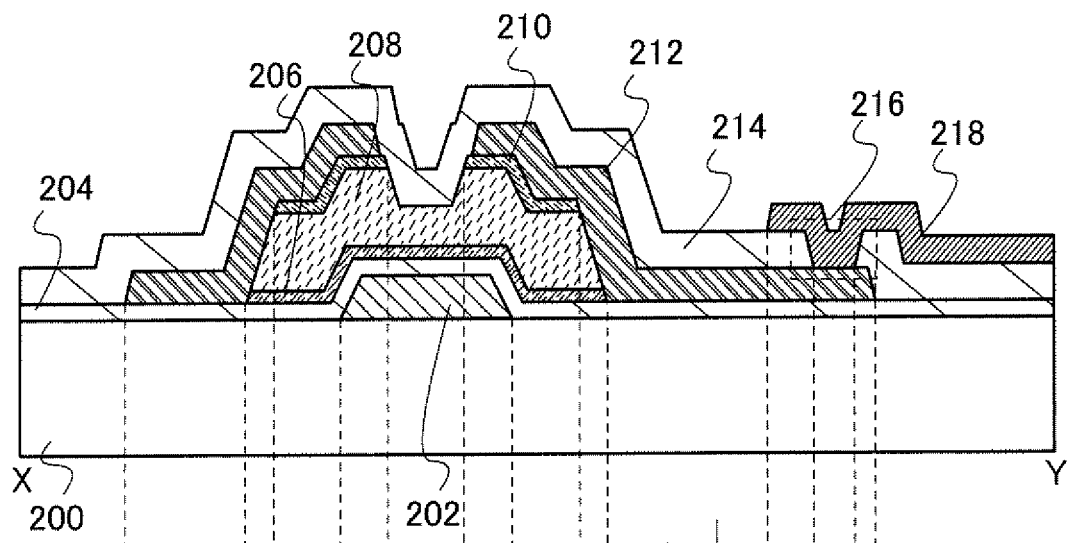
FIGS. 4A and 4B illustrate a TFT and a display device.
Figure 4B:
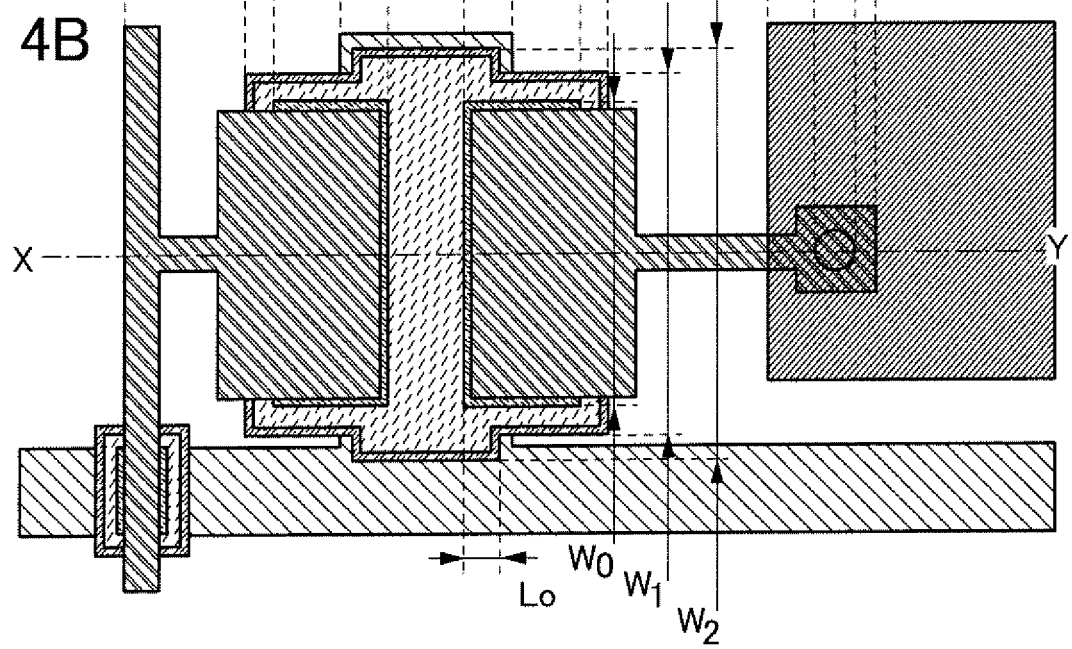

In the semiconductor layer of the TFT illustrated in FIGS. 3A and 3B, the channel formation region is enlarged only in a portion between the source region and the drain region; however, in the TFT illustrated in FIGS. 4A and 4B, the enlarged portion of the semiconductor layer is extended also in a channel length direction, and the region where the semiconductor layer is enlarged partly overlaps with the source region and the drain region. This overlapping portion is referred to as an offset region, which each overlaps with the source region and the drain region in a channel length direction by $L_0$ in a manner similar to that of FIGS. 2A and 2B. In other words, in the TFT illustrated in FIGS. 4A and 4B, the enlarged portion of the semiconductor layer is enlarged also in a channel length direction by 2 $L_0$ as compared to the TFT illustrated in FIGS. 3A and 3B.

Figure 6A:
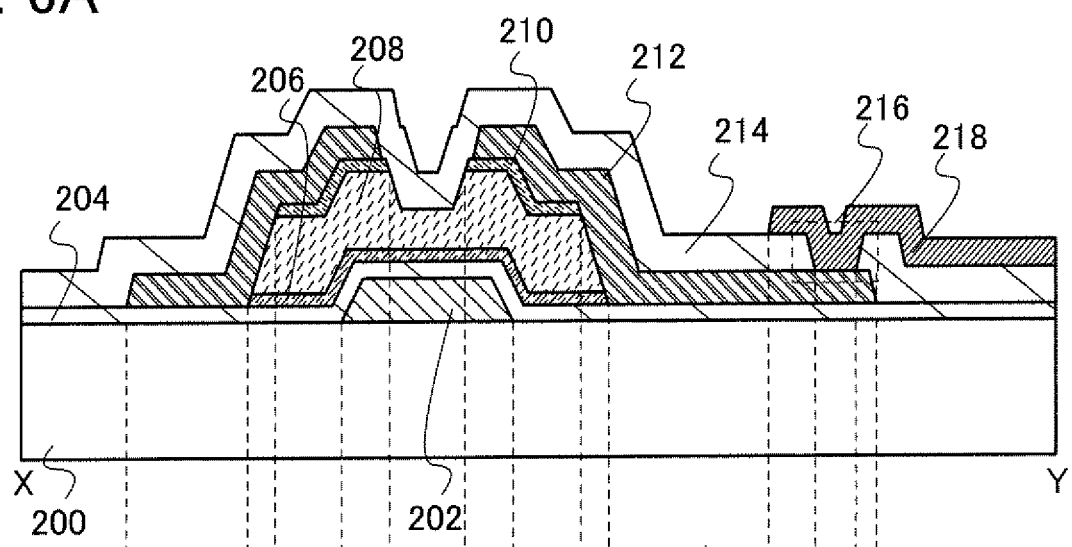
FIGS. 6A and 6B illustrate a TFT and a display device.
Figure 6B:
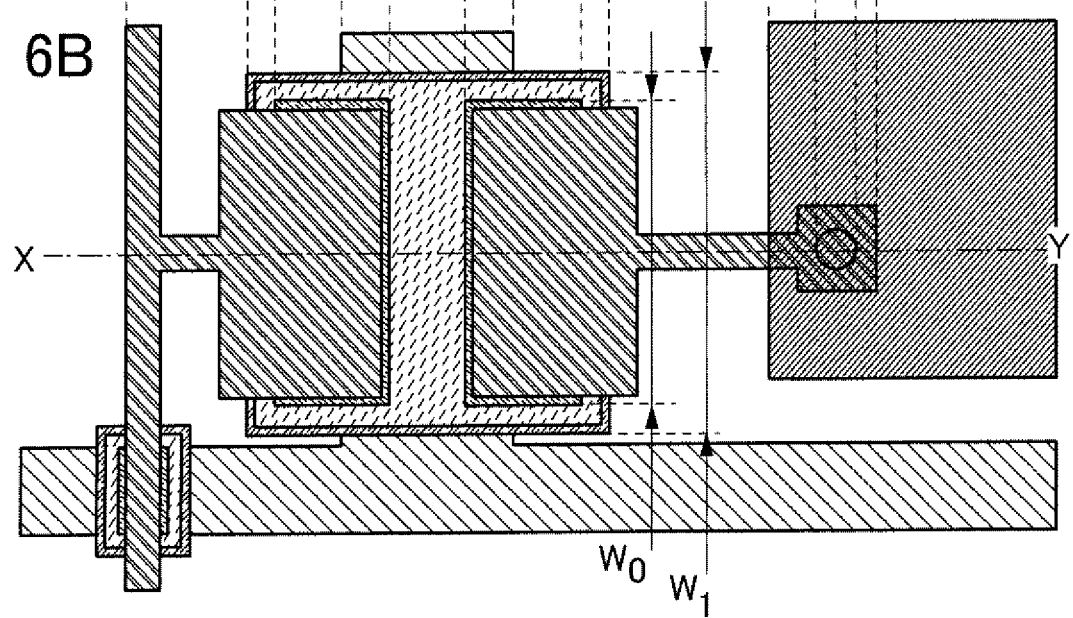

The TFT illustrated in FIGS. 3A and 3B and the TFT illustrated in FIGS. 4A and 4B each have higher field-effect mobility and larger on current than the TFT having a minimum island width $W_1$ which is illustrated in FIGS. 6A and 6B.

Note that when the TFTs illustrated in FIGS. 3A and 3B, FIGS. 4A and 4B, and FIGS. 6A and 6B are compared, the TFT illustrated in FIGS. 4A and 4B has the largest on current, whereas the TFT illustrated in FIGS. 6A and 6B has the smallest on current.

Here, a method for manufacturing the TFT illustrated in FIGS. 1A and 1B is described with reference to drawings.

First, the first wiring layer 102 is formed over the substrate 100. A glass substrate is used here as the substrate 100 (see FIG. 11A).

Figure 11A:
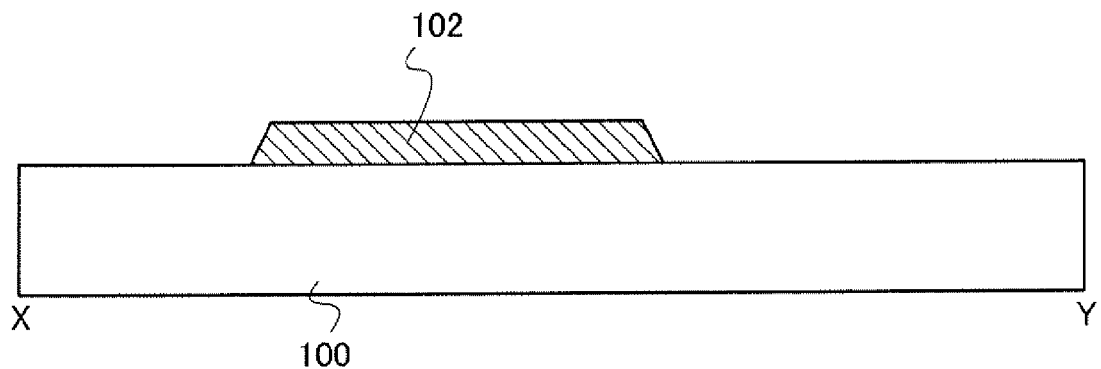
FIGS. 11A to 11C illustrate a method for manufacturing a TFT and a display device.

The first wiring layer 102 can be formed in such a manner that a conductive layer is formed over the substrate 100 by a sputtering method or a vacuum evaporation method, a mask is formed over the conductive layer by a photolithography method, an ink-jet method, or the like, and then the conductive layer is etched using the mask (see FIG. 11A). Alternatively, the first wiring layer 102 can be formed by discharging a nanopaste containing a conductive particle of Ag, Au, Cu, or the like by an inkjet method and baking the nanopaste. Note that as a barrier metal which increases adhesion between the first wiring layer 102 and the substrate 100 and prevents diffusion of a material used for the first wiring layer 102, a nitride layer of any of the aforementioned metal materials may be provided between the substrate 100 and the first wiring layer 102. Here, the first wiring layer 102 is formed in such a manner that the conductive film is formed over the substrate 100 and etched using a resist mask formed using a photomask.

Since the semiconductor layer and the source wiring (a signal line) are formed over the first wiring layer 102 in later steps, the first wiring layer 102 is preferably formed to have a tapered side surface so that the semiconductor layer and the source wiring thereover are not disconnected at a step portion. In this step, the gate wiring (a scan line) can be formed at the same time. Further, a capacitor line included in a pixel portion can also be formed. Note that a "scan line" refers to a wiring to select a pixel.

Figure 11B:
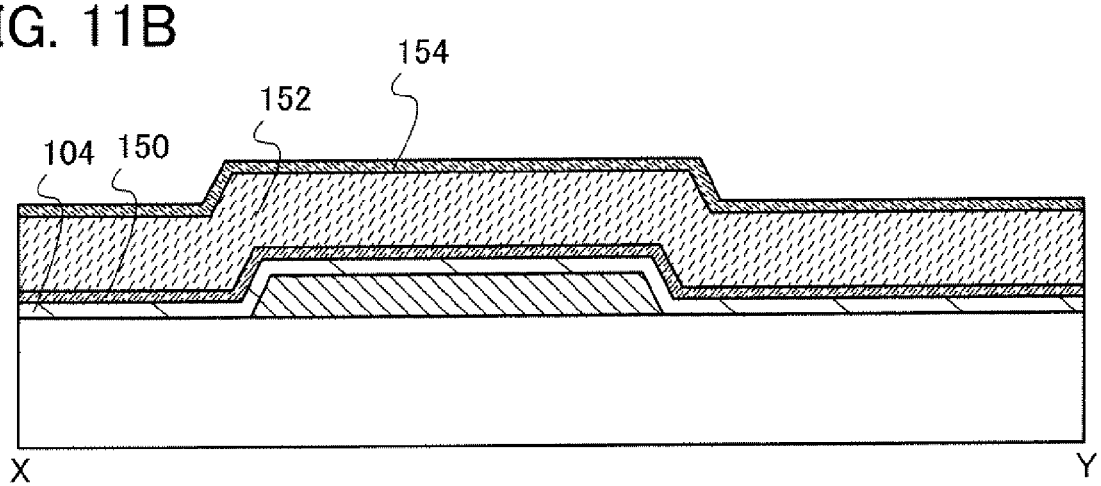

Next, the gate insulating layer 104 is formed to cover the first wiring layer 102, and a first semiconductor film 150 which is to be the first semiconductor layer 106, a second semiconductor film 152 which is to be the second semiconductor layer 108, and an impurity semiconductor film 154 which is to be the impurity semiconductor layers 110 are sequentially stacked over the gate insulating layer 104 (see FIG. 11B). Note that it is preferable that at least a film which is to be the gate insulating layer 104, the first semiconductor film 150, and the second semiconductor film 152 be formed successively. It is more preferable to form successively the films up to the impurity semiconductor film 154. Each interface of stacked films can be formed without contamination of these layers by an atmospheric constituent or an impurity element contained in the air in such a manner that at least the gate insulating layer 104, the first semiconductor film 150, and the second semiconductor film 152 are formed successively without being exposed to the air. Therefore, variations in electric characteristics of the TFT can be reduced, whereby a TFT having high reliability can be manufactured with a high yield.

The gate insulating layer 104 can be formed by a CVD method, a sputtering method, or the like. For example, the gate insulating layer 104 is formed to a thickness of greater than or equal to 50 nm, preferably 50 nm to 400 nm inclusive, more preferably 150 nm to 300 nm inclusive.

After the gate insulating layer 104 is formed and before the first semiconductor film 150 is formed, a layer which is formed to increase adhesion and prevent oxidation may be formed over the gate insulating layer 104. As such a layer which is provided to prevent oxidation and the like, for example, a stacked structure in which a silicon oxynitride layer is interposed between silicon nitride layers can be given.

The first semiconductor film 150 can be formed here using microcrystalline silicon by a plasma CVD method or the like. Note that the thickness of the first semiconductor film 150 may be 10 nm to 500 nm inclusive. The thickness of a microcrystalline semiconductor film can be adjusted with, for example, the flow rate of silane and the deposition time in a process of forming the microcrystalline semiconductor film. During deposition, it is preferable that components which interrupt crystallization, typified by oxygen or nitrogen, be reduced, and the flow rate of a dilution gas such as hydrogen be increased with respect to that of a deposition gas such as silane. At this time, the flow rate of the dilution gas is 10 times to 2000 times, inclusive, preferably 50 times to 200 times, inclusive, that of the deposition gas. In such a manner, a so-called microcrystalline semiconductor layer is formed.

In this embodiment, the carrier mobility of a crystalline semiconductor layer is approximately 2 times to 20 times, inclusive, that of an amorphous semiconductor layer. Therefore, as compared to a TFT including an amorphous semiconductor layer, the slope at the rising point of an $I_d$-$V_g$ curve of a TFT formed with a crystalline semiconductor layer is steeper. Here, $I_d$ refers to a drain current, and $V_g$ refers to a gate voltage. Note that "drain current" refers to a current flowing between the source electrode and the drain electrode. Therefore, a TFT in which a crystalline semiconductor layer is used for a channel formation region is superior in response as a switching element and can operate at high speed. Thus, with the use of a TFT in which a crystalline semiconductor layer is used for a channel formation region as a switching element of a display device, the area of the channel formation region (i.e., the area of the TFT) can be reduced. Furthermore, when part or whole of a driver circuit is formed over the same substrate as a pixel portion, a system-on-panel can be obtained.

However, the crystalline semiconductor layer often exhibits low n-type conductivity even when an impurity element for the purpose of valence electron control is not added thereto. Thus, the threshold voltage $V_{th}$ of the TFT may be controlled in such a manner that an impurity element imparting p-type conductivity (e.g., boron) is added to the crystalline semiconductor layer that functions as the channel formation region of the TFT at the same time as or after the crystalline semiconductor layer is formed. As an example of an impurity element imparting p-type conductivity, there is boron, and a gas containing an impurity element such as diborane ($B_2H_6$) or boron trifluoride ($BF_3$) may be mixed into silicon hydride, at a proportion of 1 ppm to 1000 ppm, preferably 1 ppm to 100 ppm. The concentration of boron in the crystalline semiconductor layer is preferably set to be from $1\times10^{14}$ cm$^{-3}$ to $6\times10^{16}$ cm$^{-3}$, for example.

Before the first semiconductor film 150 is formed, impurity elements in the reaction chamber of the plasma CVD apparatus are removed by introducing a deposition gas containing silicon or germanium while exhausting the air in the reaction chamber, so that impurity elements at the interface of the films which are formed can be reduced. Accordingly, electric characteristics of the TFT can be improved.

The second semiconductor film 152 is formed to be the second semiconductor layer 108. The second semiconductor film 152 is formed using glow discharge plasma in a reaction chamber of a plasma CVD apparatus with the use of a mixture of hydrogen and a deposition gas containing silicon. At this time, film formation is performed under a condition in which the flow rate of hydrogen with respect to a deposition gas containing silicon is reduced, as compared to a deposition condition of the first semiconductor film 150, to suppress crystal growth. Accordingly, the crystal growth in the semiconductor film of the second semiconductor layer 108 is suppressed and a buffer layer which contributes to reduction of off current can be formed.

Here, the case will be described where the second semiconductor layer 108 is formed with a well-ordered semiconductor which has fewer defects and whose tail of a level at a band edge (a mobility edge) in the valence band is steeper as compared to the conventional amorphous semiconductor. Such a semiconductor layer is formed so that the crystal growth of the second semiconductor film 152 is suppressed in such a manner that a gas containing nitrogen is mixed into the source gas for forming a crystalline semiconductor film, the flow rate of hydrogen with respect to a deposition gas is preferably reduced as compared to a deposition condition of the first semiconductor film 150, and a plasma CVD method is used. At this time, the flow rate of a dilution gas is 10 times to 2000 times, inclusive, preferably 50 times to 200 times, inclusive, that of the deposition gas.

At the initial stage of deposition of the second semiconductor film 152, the flow rate of hydrogen with respect to the deposition gas containing silicon is reduced as compared to the deposition condition of the first semiconductor film 150, whereby a microcrystalline semiconductor region can remain in the second semiconductor layer 108. In addition, the flow rate of hydrogen with respect to the deposition gas containing silicon is further reduced as compared to the above condition, so that the second semiconductor layer 108 can be a layer containing an amorphous semiconductor. Furthermore, the flow rate of hydrogen with respect to the deposition gas containing silicon is further reduced as compared to the above condition and a gas containing nitrogen is mixed, so that an amorphous semiconductor region in the second semiconductor layer 108 can be increased.

In addition, at the initial stage of the deposition of the second semiconductor film 152, the first semiconductor film 150 is used as a seed crystal and the film is deposited on the entire surface. After that, the crystal growth is partly suppressed, and a conical or pyramidal microcrystalline semiconductor region grows (in the middle stage of the deposition). Further, the crystal growth of the conical or pyramidal microcrystalline semiconductor region is suppressed, and the second semiconductor film 152 which does not contain a microcrystalline semiconductor region in the upper side is formed (in the later stage of the deposition).

The impurity semiconductor layers 110 can be formed in such a manner that the impurity semiconductor film 154 is formed and then etched. In the case where a TFT having n-type conductivity is formed, phosphorus may be added as an impurity element and a gas containing phosphine ($PH_3$) may be added to silicon hydride to form the impurity semiconductor layers 110, for example. In the case where a TFT having p-type conductivity is formed, boron may be added as an impurity element in a source gas and a gas containing diborane may be added to silicon hydride, for example. Further, as the impurity semiconductor layers 110, either a crystalline semiconductor or an amorphous semiconductor may be used, but it is preferable to use a crystalline semiconductor. The impurity semiconductor layers 110 may have a thickness which enables ohmic contact between the second semiconductor layer 108 and the second wiring layers 112, and is preferably formed to a thickness of approximately 2 nm to 60 nm inclusive. When the impurity semiconductor layers 110 are thinned as much as possible, throughput can be improved. When the impurity semiconductor layers 110 are formed using a crystalline semiconductor, components which interrupt crystallization, typified by oxygen or nitrogen, are reduced, and the flow rate of a dilution gas such as hydrogen with respect to that of a deposition gas such as silane is increased. At this time, when the impurity semiconductor layers 110 are formed using an amorphous semiconductor, the flow rate of a dilution gas is 1 to 10 times, inclusive, preferably 1 to 5 times, inclusive, that of the deposition gas, whereas, when the impurity semiconductor layers 110 are formed using a crystalline semiconductor, the flow rate of a dilution gas is 10 times to 2000 times, inclusive, preferably 50 times to 200 times, inclusive, that of the deposition gas. In such a manner, a so-called microcrystalline semiconductor layer is formed.

As described above, layers from the gate insulating layer 104 to the impurity semiconductor film 154 are preferably formed successively (see FIG. 11B). With a multi-chamber CVD apparatus provided with a plurality of reaction chambers, a reaction chamber can be provided for each kind of deposition film, and a plurality of different films can be formed successively without being exposed to the air.

Figure 14:
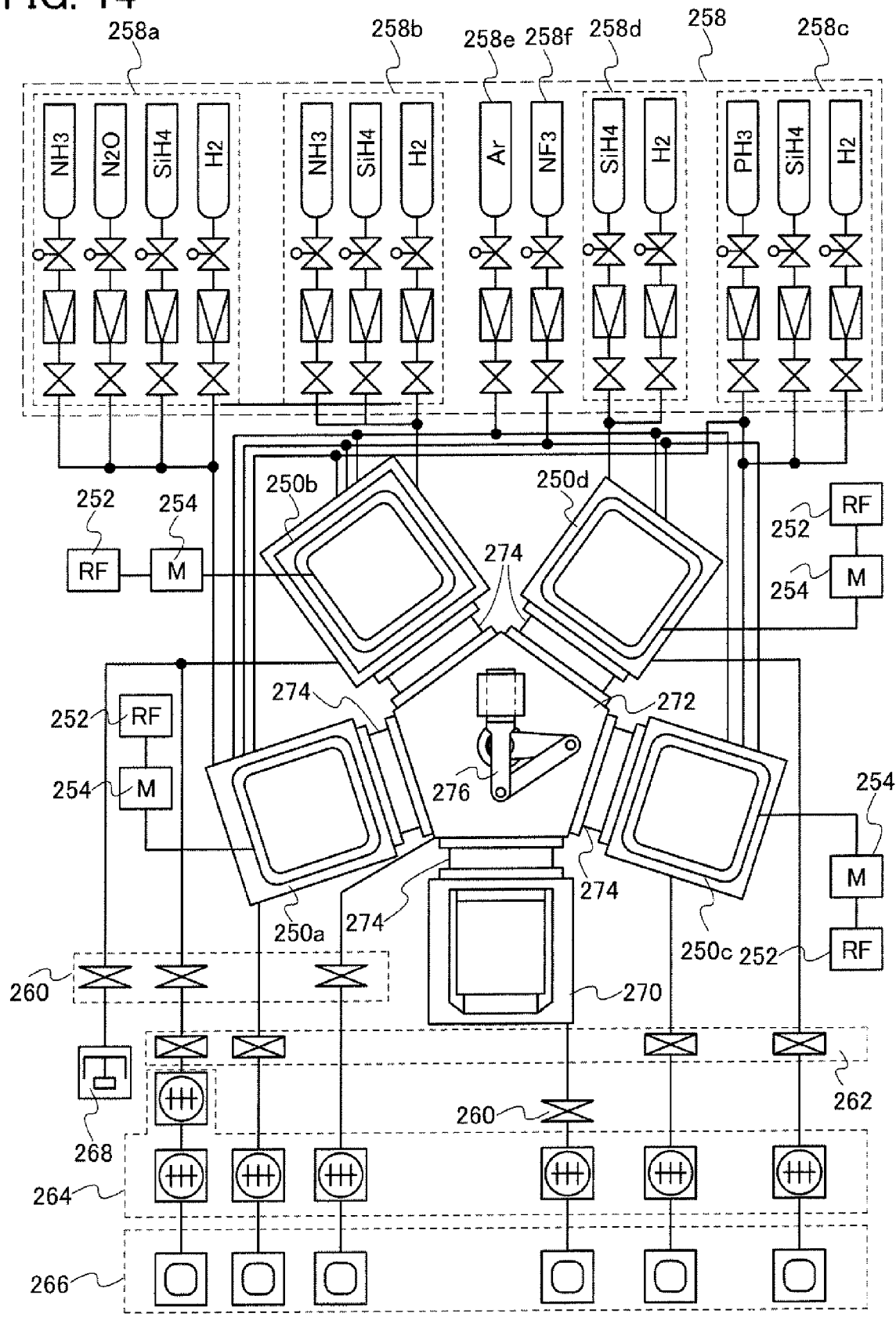
FIG. 14 illustrates a method for manufacturing a TFT and a display device.

FIG. 14 is a schematic top cross-sectional view of an example of a multi-chamber plasma CVD apparatus provided with a plurality of reaction chambers. The apparatus is provided with a common chamber 272, a load/unload chamber 270, a first reaction chamber 250a, a second reaction chamber 250b, a third reaction chamber 250c, and a fourth reaction chamber 250d. After the substrate 100 is set in a cassette of the load/unload chamber 270, the substrate 100 is transferred to and from each reaction chamber with a transfer unit 276 of the common chamber 272. A gate valve 274 is provided between the common chamber 272 and each reaction chamber, and between the common chamber 272 and the load/unload chamber, so that treatment performed in each reaction chamber does not interfere with each other. Each reaction chamber can be used for a different purpose, depending on the kind of thin film to be formed. For example, an insulating film is formed in the first reaction chamber 250a; a semiconductor film is formed in the second reaction chamber 250b and the fourth reaction chamber 250d; and a semiconductor film to which an impurity element imparting one conductivity type is added is formed in the third reaction chamber 250c. Since an optimum deposition temperature varies depending on a thin film to be formed, the reaction chambers are separated to facilitate the control of deposition temperatures, and thus each thin film can be formed at its optimal temperature. Further, the same kind of films can be repeatedly deposited, so that influence of a residue attributed to a film formed previously can be avoided. One film may be formed with one reaction chamber, or a plurality of films with similar compositions, such as a crystalline semiconductor film and an amorphous semiconductor film, may be formed with one reaction chamber.

A turbo-molecular pump 264 and a dry pump 266 are connected to each reaction chamber as an exhaust unit. The exhaust unit is not limited to a combination of these vacuum pumps and may employ other vacuum pumps as long as they can evacuate the reaction chamber to a degree of vacuum of approximately $10^{-5}$ Pa to $10^{-1}$ Pa. Note that a cryopump 268 is preferably connected to the second reaction chamber 250b so that the pressure in the reaction chamber can be reduced to approximately $10^{-5}$ Pa or less. One of or both a butterfly valve 260 and a conductance valve 262 are provided between the exhaust unit and each reaction chamber. The butterfly valve 260 can block a path between the exhaust unit and the reaction chamber. Further, the conductance valve 262 can adjust the pumping speed and the pressure in each reaction chamber.

The cryopump 268 connected to the second reaction chamber 250b can also reduce the pressure in the reaction chamber to lower than $10^{-5}$ Pa (preferably, an ultrahigh vacuum). In this embodiment, the second reaction chamber 250b is evacuated to a pressure of lower than $10^{-5}$ Pa, whereby an atmospheric component such as oxygen can be prevented from being mixed into the semiconductor film. Consequently, the oxygen concentration contained in the semiconductor film can be less than or equal to $1 \times 10^{16}$ cm$^{-3}$.

A gas supply unit 258 includes a cylinder filled with a source gas, a stop valve, a mass flow controller, and the like. A gas supply unit 258a is connected to the first reaction chamber 250a and supplies a gas which is used to form the insulating film. A gas supply unit 258b is connected to the second reaction chamber 250b and supplies a gas which is used to form a semiconductor film. A gas supply unit 258c is connected to the third reaction chamber 250c and supplies a semiconductor source gas to which an impurity element imparting n-type conductivity is added, for example. A gas supply unit 258d is connected to the fourth reaction chamber 250d and supplies a gas which is used to form a semiconductor film. A gas supply unit 258e supplies Ar. A gas supply unit 258f supplies an etching gas (here, a NF$_3$ gas) used for cleaning of the inside of the reaction chambers. Since Ar gas and an etching gas used for cleaning are used in all the reaction chambers, the gas supply unit 258e and the gas supply unit 258f are preferably connected to all the reaction chambers.

A high-frequency power supply unit for producing plasma is connected to each reaction chamber. Here, the high-frequency power supply unit includes a high-frequency power source 252 and a matching box 254. A microwave generator may also be connected to each reaction chamber, without limitation to the above. For example, RF plasma, VHF plasma, or microwave plasma is generated. Note that by generating RF plasma and VHF plasma at the same time (two frequency excitation), the deposition rate is improved, which is preferable.

The plasma used here is preferably pulse modulation plasma. With the use of the pulse modulation plasma, the deposition rate in film formation can be improved, generation of particles in film formation can be suppressed, and the quality and thickness uniformity of the semiconductor film which is formed can be improved. Further, the amount of generation of UV rays in plasma generation can be suppressed, and thus the number of defects in the semiconductor film which is formed can be reduced.

A crystalline semiconductor film, an amorphous semiconductor film, and an impurity semiconductor film to which an impurity element imparting one conductivity type is added may be formed successively in one reaction chamber. Specifically, a substrate provided with a gate insulating film is placed in a reaction chamber, and a crystalline semiconductor film, an amorphous semiconductor film, and a semiconductor film to which an impurity element imparting one conductivity type is added (an impurity semiconductor film) are formed therein successively. The crystalline semiconductor film and the amorphous semiconductor film are formed successively in one reaction chamber, whereby an interface with little crystal distortion can be formed. Therefore, formation of an unintended level at the interface can be prevented. Then, an atmospheric component that can be mixed into the interface can be reduced.

In addition, although not illustrated, a spare chamber may be connected to the multi-chamber plasma CVD apparatus of FIG. 14. When a substrate is preheated in the spare chamber before film formation, heating time that is required before deposition of a film in each reaction chamber can be shortened, whereby throughput can be improved.

By successive deposition as described above, a plurality of films can be stacked without interfaces being contaminated due to a contaminant impurity element. Thus, variation in electric characteristics of the TFT can be reduced.

When the plasma CVD apparatus described above is used, a film of one kind or plural kinds of films of similar compositions can be formed successively without being exposed to the air in each reaction chamber. Thus, a plurality of films can be stacked without interfaces being contaminated due to a residue of a film which has already been formed or an impurity element contained in the air.

The inside of the reaction chamber of the plasma CVD apparatus may be cleaned with fluorine radicals. Then, a protective film is preferably formed inside the reaction chamber before film formation.

An apparatus that can be used is not limited to the one illustrated in FIG. 14. For example, a CVD apparatus provided with two reaction chambers may be used. In such a case, one reaction chamber (a first reaction chamber) may be used to form a silicon oxide film including tetraethoxysilane (TEOS: $Si(OC_2H_5)_4$) for a source gas, and the other reaction chamber (a second reaction chamber) may be used to form a silicon nitride film, a silicon film, and a silicon film containing an impurity element imparting one conductivity type. Alternatively, an apparatus provided with only the second reaction chamber may be used.

Figure 11C:
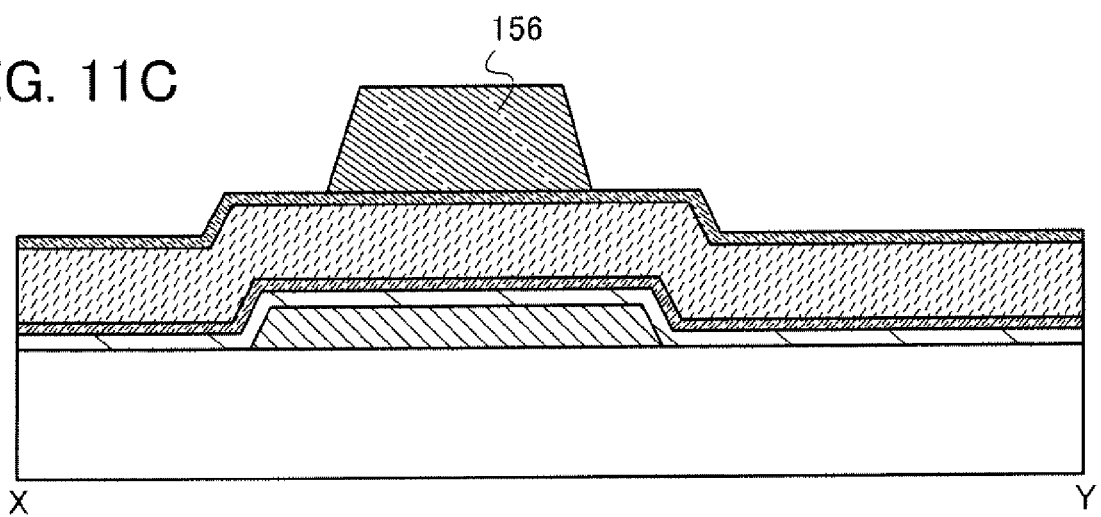

Next, a resist mask 156 is formed over the impurity semiconductor film 154 which is to be the impurity semiconductor layers 110 (see FIG. 11C). The resist mask 156 can be formed by a photolithography method. Alternatively, the resist mask 156 may be formed by an ink-jet method or the like. Further alternatively, for the purpose of cost reduction, the resist mask 156 may be formed by a printing method or subjected to laser processing after being formed by a printing method.

Figure 12A:
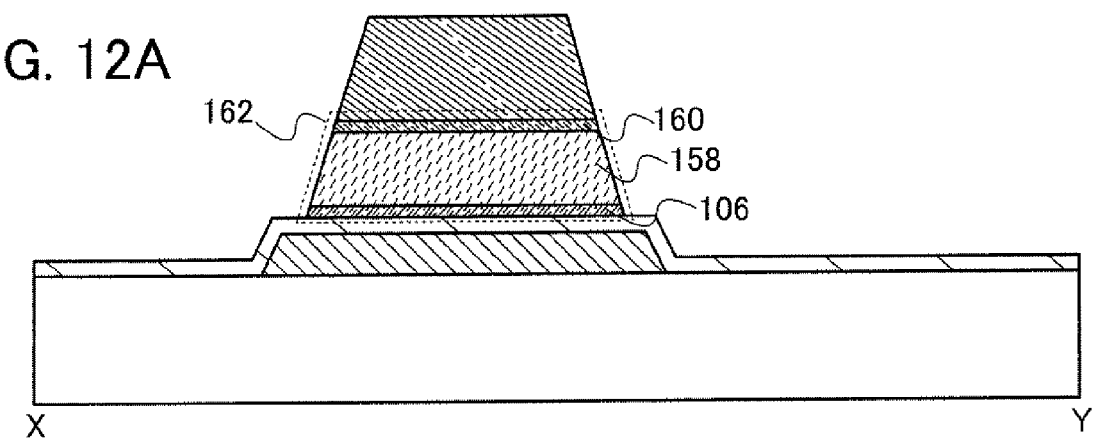
FIGS. 12A to 12C illustrate a method for manufacturing a TFT and a display device.

Next, the first semiconductor film 150, the second semiconductor film 152, and the impurity semiconductor film 154 are etched using the resist mask 156. By this treatment, these films can be separated corresponding to each element, and the first semiconductor layer 106, a second semiconductor layer 158, and an impurity semiconductor layer 160 are formed (see FIG. 12A). After that, the resist mask 156 is removed.

This etching treatment is preferably performed so that a stack 162 including the first semiconductor layer 106, the second semiconductor layer 158, and the impurity semiconductor layer 160 can have a tapered shape. The taper angle is 30° to 90° inclusive, preferably 40° to 80° inclusive. When the stack 162 has a tapered shape, coverage with a layer to be formed thereover (e.g., a conductive film 164) in a later step can be improved, and disconnection of a wiring or the like can be prevented.

Figure 12B:
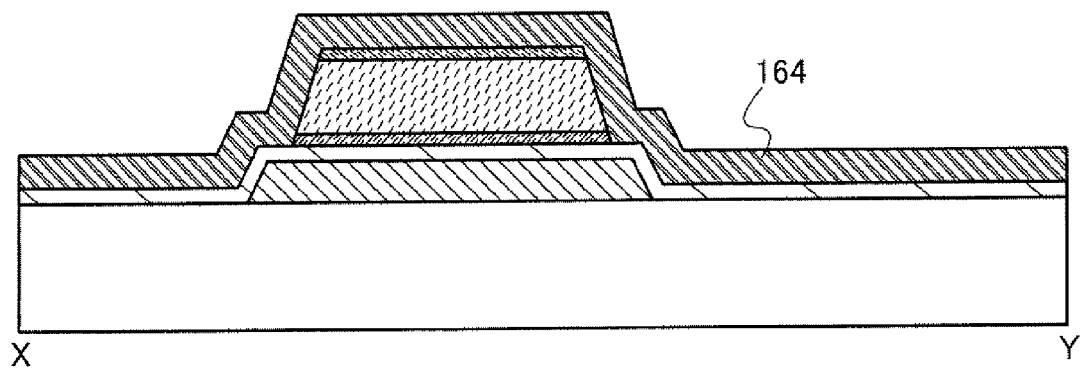

Next, the conductive film 164 is formed over the stack 162 (see FIG. 12B). The conductive film 164 may be formed by a sputtering method, a vacuum evaporation method, or the like. Alternatively, the conductive film 164 may be formed by discharging a conductive nanopaste of Ag, Au, Cu, or the like by a screen printing method, an ink-jet method, or the like and baking the nanopaste.

Figure 12C:
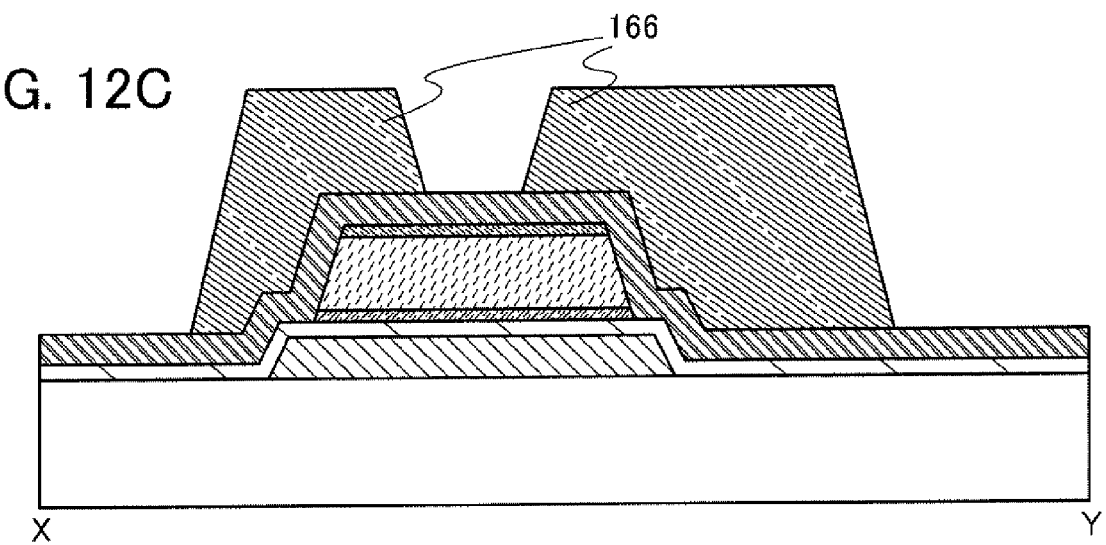

Next, a resist mask 166 is formed over the conductive film 164 (see FIG. 12C). In a manner similar to that of the resist mask 156, the resist mask 166 can be formed by a photolithography method or an ink-jet method. Alternatively, for the purpose of cost reduction, the resist mask 166 may be formed by a printing method or subjected to laser processing after being formed by a printing method. Further alternatively, oxygen plasma ashing may be performed to control the size of the resist mask.

Next, the conductive film 164 is etched to be patterned using the resist mask 166, whereby the second wiring layers 112 are formed. Wet etching is preferably used for etching. By wet etching, a portion of the conductive film 164 which is not covered with the resist mask 166 is etched isotropically. As a result, the conductive film recedes so that it is on an inner side than the side surface of the resist mask 166, and thus the second wiring layers 112 are formed. The second wiring layers 112 serve not only as the source electrode and the drain electrode of the TFT but also as a signal line.

Next, in a state where the resist mask 166 is formed, the second semiconductor layer 158 and the impurity semiconductor layer 160 are etched to form a back channel portion. Accordingly, the second semiconductor layer 158 is etched to leave part thereof, whereby the second semiconductor layer 108 and the impurity semiconductor layers 110 are formed.

At this time, as the etching process, dry etching, particularly, dry etching using a gas containing oxygen is preferably performed. This is because, with the use of the gas containing oxygen, the impurity semiconductor layers 110 and the second semiconductor layer 108 can be formed by etching while the resist is reduced in its size, so that the impurity semiconductor layers 110 and the second semiconductor layer 108 can be formed to have a tapered shape. As the etching gas, for example, an etching gas in which oxygen is mixed into tetrafluoromethane ($CF_4$) or an etching gas in which oxygen is mixed into chlorine is used. The tapered shape of the impurity semiconductor layers 110 and the second semiconductor layer 108 can prevent concentration of an electric field and can reduce off current.

The second semiconductor layer 108 has a depression portion which is formed when part of the second semiconductor layer 108 is etched off. The second semiconductor layer 108 is preferably formed to a thickness such that at least part of the second semiconductor layer 108 which overlaps with the depression portion remains after etching. Regions of the second semiconductor layer 108 which overlap with the impurity semiconductor layers 110 are not etched in forming the source and drain regions, and may have a thickness of approximately 80 nm to 500 nm inclusive, preferably 150 nm to 400 nm inclusive, more preferably 200 nm to 300 nm inclusive. The second semiconductor layer 108 is formed with a sufficient thickness as described above, whereby mixture of an impurity element or the like into the first semiconductor layer 106 can be prevented. In this manner, the second semiconductor layer 108 also serves as a protective layer of the first semiconductor layer 106.

Next, the resist mask 166 is removed.

A constituent of a resist stripper used for removal of the resist mask 166, a residue in the back channel portion generated in the above steps, or the like often has an adverse effect on electric characteristics. Therefore, in order to remove such a constituent, a residue, or the like, one or more steps of etching, plasma treatment, and cleaning are further performed after removal of the resist mask 166, whereby a TFT with high electric characteristics (e.g., small off current) can be manufactured.

Figure 13A:
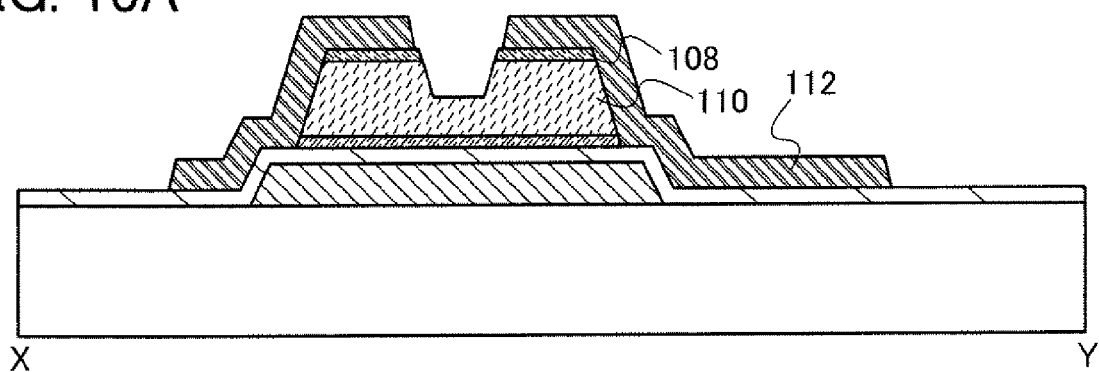
FIGS. 13A to 13C illustrate a method for manufacturing a TFT and a display device.

Through the above process, the bottom-gate TFT illustrated in FIGS. 1A and 1B can be manufactured (see FIG. 13A). Note that the process for manufacturing the bottom-gate TFT illustrated in FIGS. 2A and 2B, FIGS. 3A and 3B, FIGS. 4A and 4B, FIGS. 5A and 5B, FIGS. 6A and 6B, and FIGS. 7A and 7B is also similar to that of the TFT illustrated in FIGS. 1A and 1B.

Figure 13B:
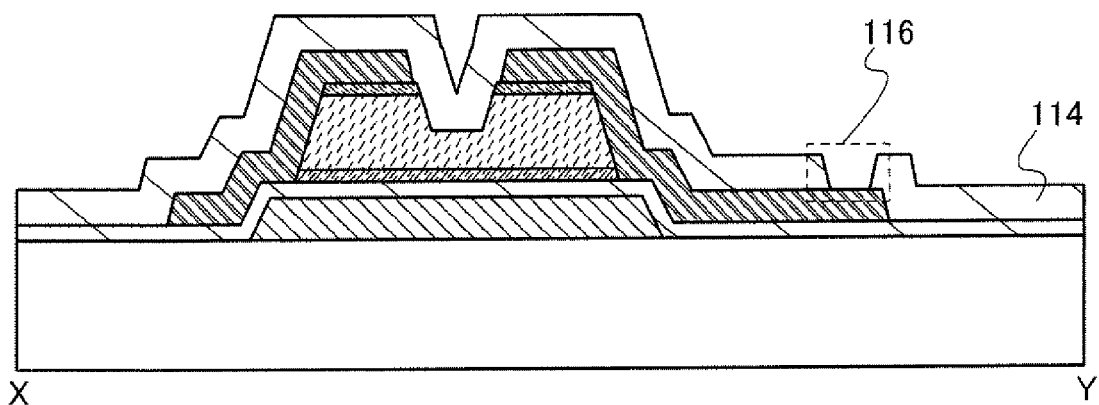

Next, a protective layer 114 is formed to cover the TFT manufactured as described above (see FIG. 13B). The protective layer 114 can be formed in a manner similar to that of the gate insulating layer 104.

Note that the TFT illustrated in FIGS. 1A and 1B can be used as a pixel transistor, and thus, one of the source electrode and the drain electrode is connected to the pixel electrode. In the TFT illustrated in FIGS. 1A and 1B, one of the source electrode and the drain electrode is connected to the pixel electrode layer 118 through the opening 116 provided in the protective layer 114.

The pixel electrode layer 118 can be formed by a sputtering method or the like. Here, ITO may be formed by a sputtering method.

Figure 13C:
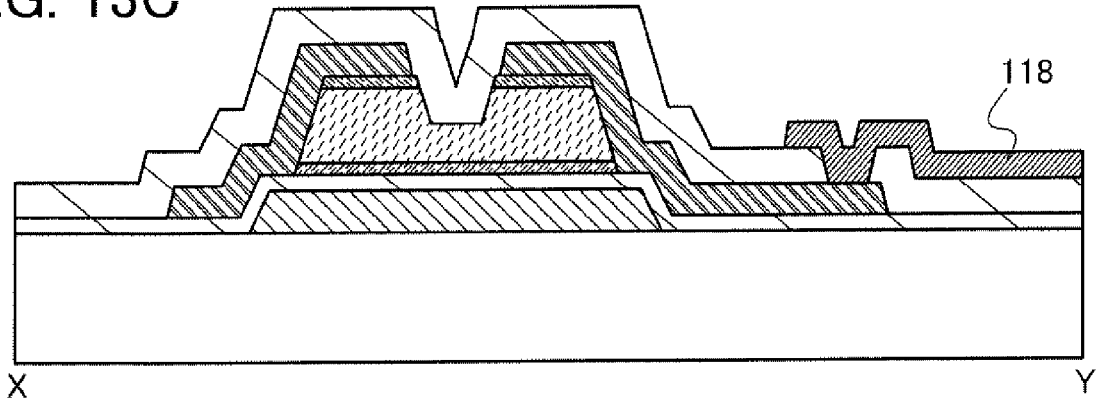

The pixel electrode layer 118 may be formed in a manner similar to that of the second wiring layers 112 or the like, in other words, a conductive film is formed over the entire surface and etched using a resist mask or the like to be patterned (see FIG. 13C).

Although not illustrated, an organic resin layer may be formed between the protective layer 114 and the pixel electrode layer 118 by a spin coating method or the like so that a surface where the pixel electrode layer 118 is formed can be flat.

Note that in the above description, the gate electrode and the scan line are formed in the same process, and the source and drain electrodes and the signal line are formed in the same process. However, the disclosed invention is not limited thereto. The electrode and the wiring connected to the electrode may be formed in different processes.

Note that although the case of using silicon as a semiconductor material is described in this embodiment, an oxide semiconductor or an organic semiconductor may be used without limitation thereto.

Note that although inverted-staggered TFT is described in this embodiment, a coplanar type may be employed without limitation thereto.

Note that although silicon is used as a semiconductor material in this embodiment, germanium may be used without limitation thereto. Instead of silane, a deposition gas such as $GeH_4$ or $Ge_2H_6$ may be used.

Figure 15A:
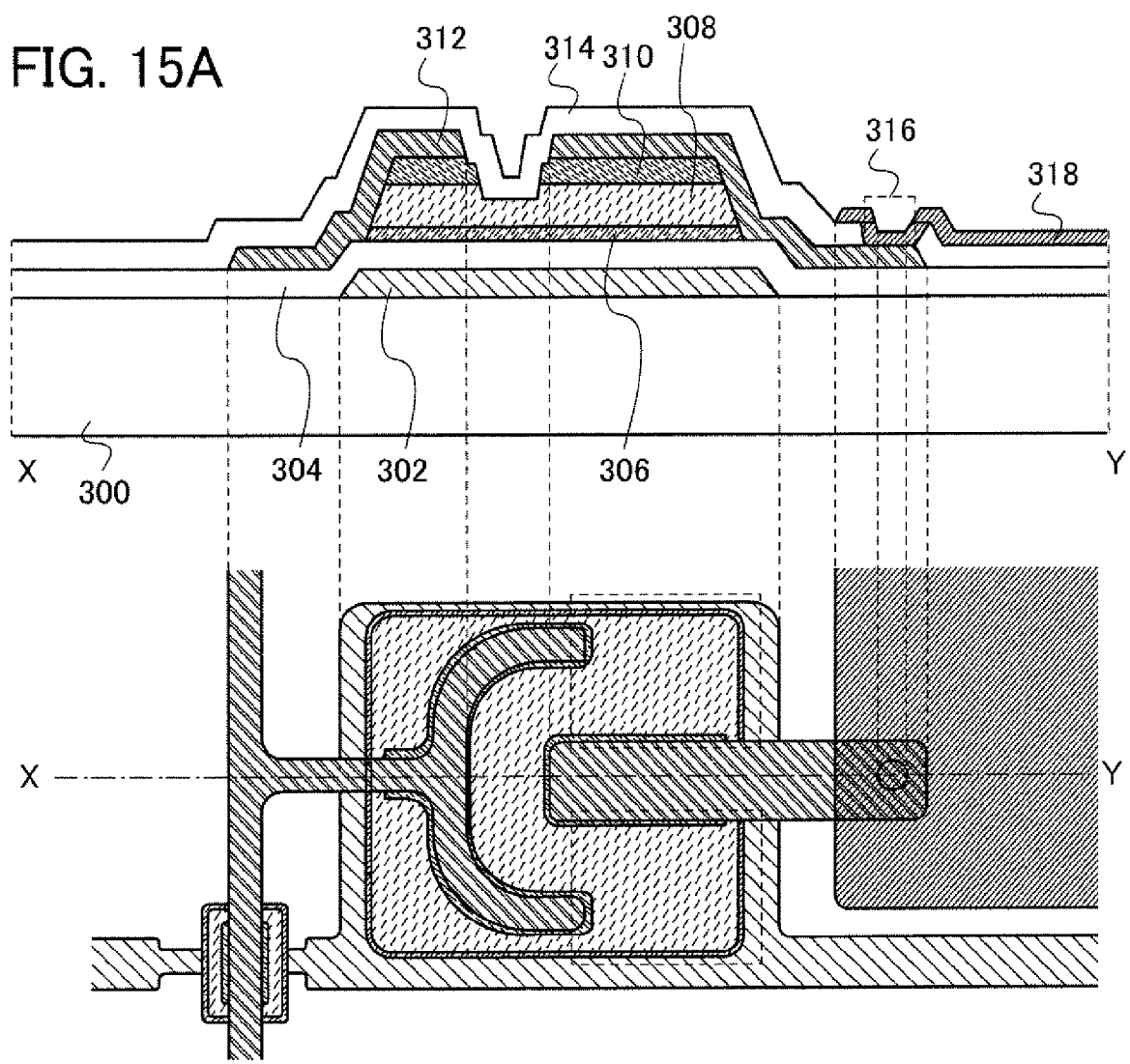
FIGS. 15A and 15B illustrate a TFT and a display device.
Figure 15B:
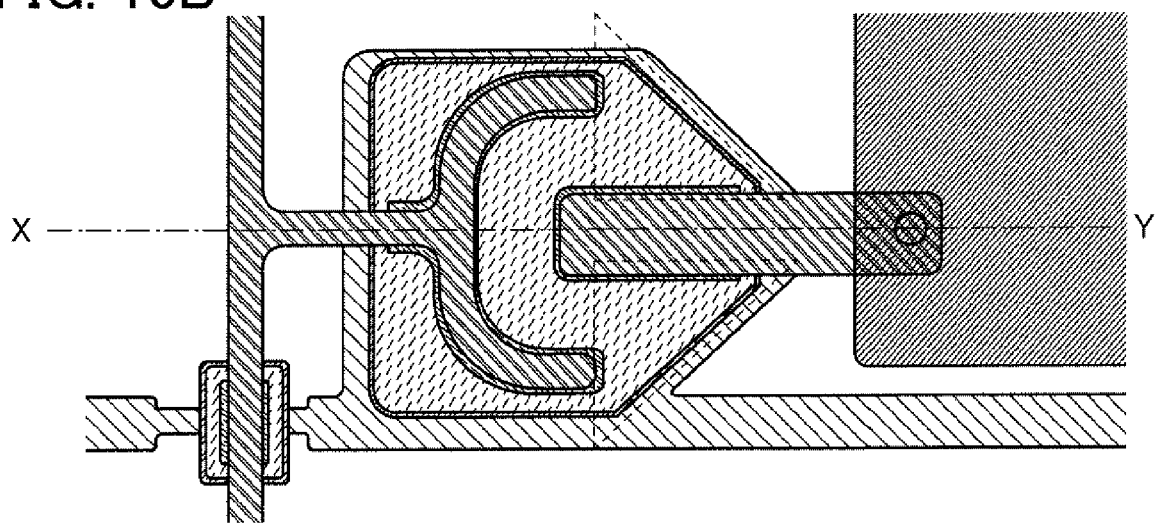

Note that the TFT may be a U-shape (reversed C-shape or horseshoe shape) without limitation to the above description. FIGS. 15A and 15B illustrate a U-shape TFT.

Note that the cross-sectional structure is similar to those illustrated in FIGS. 1A and 1B. A substrate 300 corresponds to the substrate 100 in FIGS. 1A and 1B. A first wiring layer 302 corresponds to the first wiring layer 102 in FIGS. 1A and 1B. A gate insulating layer 304 corresponds to the gate insulating layer 104 in FIGS. 1A and 1B. A first semiconductor layer 306 corresponds to the first semiconductor layer 106 in FIGS. 1A and 1B. A second semiconductor layer 308 corresponds to the second semiconductor layer 108 in FIGS. 1A and 1B. Impurity semiconductor layers 310 correspond to the impurity semiconductor layers 110 in FIGS. 1A and 1B. Second wiring layers 312 correspond to the second wiring layers 112 in FIGS. 1A and 1B. A protective layer 314 corresponds to the protective layer 114 in FIGS. 1A and 1B. An opening 316 corresponds to the opening 116 in FIGS. 1A and 1B. A pixel electrode layer 318 corresponds to the pixel electrode layer 118 in FIGS. 1A and 1B. Note that the semiconductor layer is provided between a scan line and a signal line in FIGS. 15A and 15B similarly to FIGS. 1A and 1B; however, in FIGS. 15A and 15B, part of the scan line is processed to be thin and thus parasitic capacitance between the scan line and the signal line is further reduced.

When the TFT has the shape illustrated in FIG. 15A, the maximum island width of the TFT can be increased and thus on current can be increased. Further, variations in electric characteristics can be reduced. In this case, current enters and passes through a region surrounded with a dotted line; therefore, on current can be increased.

Alternatively, the TFT may have the shape illustrated in FIG. 15B. Also in this case, current enters and passes through a region surrounded with a dotted line; therefore, on current can be increased. Further, the area occupied by the gate electrode which is formed using the first wiring layer can be reduced; therefore, an aperture ratio can be improved.

As described above in this embodiment, the island width of the semiconductor layer is partly increased, whereby on current can be increased without increase in parasitic capacitance between the first wiring layer and the second wiring layer. Therefore, when the TFT of this embodiment is applied to a pixel TFT, high-speed operation of a pixel thereof can be performed. Alternatively, since the width of the source or the drain can be made narrow without change of the maximum island width of the semiconductor layer, parasitic capacitance between the first wiring layer and the second wiring layer can be reduced. Therefore, when the TFT of this embodiment is applied to a pixel TFT, wiring delay can be suppressed and high-speed operation of a pixel thereof can be performed.

Embodiment 2

In this embodiment, one mode of a display panel or a light-emitting panel on which the TFT described in Embodiment 1 is mounted will be described with reference to drawings.

In the display device or the light-emitting device according to this embodiment, a signal line driver circuit and a scan line driver circuit may be formed over a different substrate (e.g., a semiconductor substrate or an SOI substrate) and then connected to the pixel portion or may be formed over the same substrate as a pixel circuit.

Note that there are no particular limitations on the connection method of a substrate separately formed, and a known method such as a COG method, a wire bonding method, or a TAB method can be used. Further, a connection position is not limited as long as electrical connection is possible. Alternatively, a controller, a CPU, a memory, or the like may be formed separately and connected to the pixel circuit.

Figure 16:
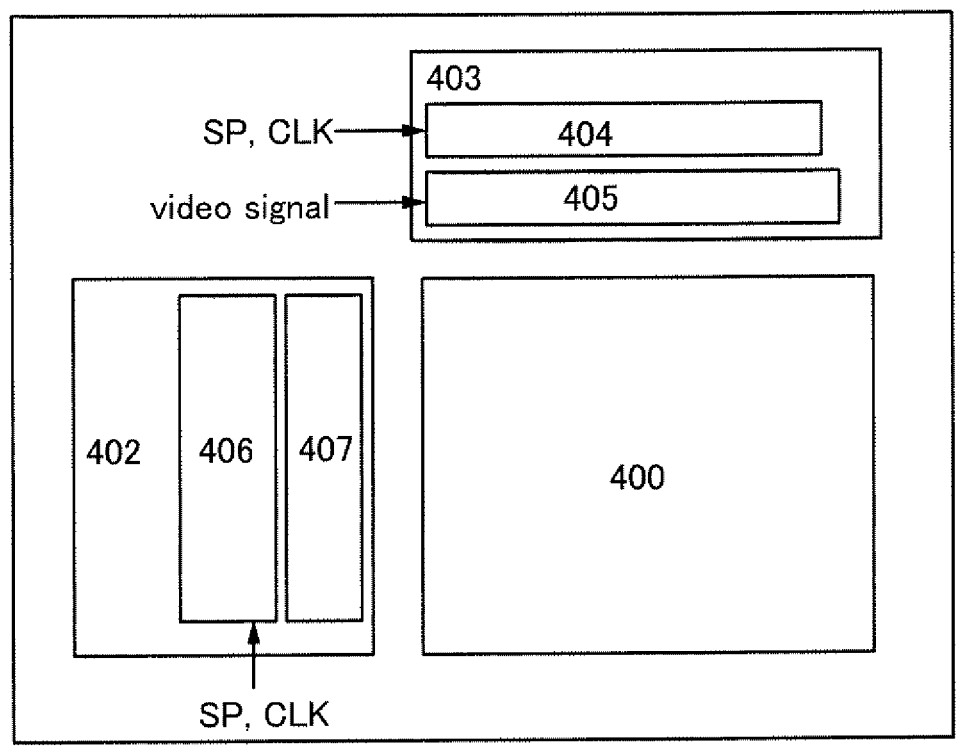
FIG. 16 illustrates a display device.

FIG. 16 illustrates a block diagram of a display device. The display device illustrated in FIG. 16 includes a pixel portion 400 including a plurality of pixels each provided with a display element, a scan line driver circuit 402 which selects each pixel, and a signal line driver circuit 403 which controls input of a video signal to a selected pixel.

Note that the display device which is one mode of the disclosed invention is not limited to the mode illustrated in FIG. 16. That is, the signal line driver circuit is not limited to a mode including only a shift register and an analog switch. In addition to the shift register and the analog switch, another circuit such as a buffer, a level shifter, or a source follower may be included. Note that the shift register and the analog switch are not necessarily provided. For example, another circuit such as a decoder circuit by which a signal line can be selected may be used instead of the shift register, or a latch or the like may be used instead of the analog switch.

The signal line driver circuit 403 illustrated in FIG. 16 includes a shift register 404 and an analog switch 405. A clock signal (CLK) and a start pulse signal (SP) are inputted to the shift register 404. When the clock signal (CLK) and the start pulse signal (SP) are inputted, a timing signal is generated in the shift register 404 and inputted to the analog switch 405.

Note that a video signal is supplied to the analog switch 405. The analog switch 405 samples the video signal in accordance with the inputted timing signal and supplies the sampled signal to a signal line of the next stage.

The scan line driver circuit 402 illustrated in FIG. 16 includes a shift register 406 and a buffer 407. Further, a level shifter may be included. In the scan line driver circuit 402, when the clock signal (CLK) and the start pulse signal (SP) are inputted to the shift register 406, a selection signal is generated. The generated selection signal is buffered and amplified by the buffer 407, and the buffered and amplified signal is supplied to a corresponding scan line. Gates of all pixel transistors of one line are connected to one scan line.

Further, since the pixel transistors of one line should be turned on at the same time in the operation, the buffer 407, which can supply large current, is used.

In a full-color display device, when video signals corresponding to R (red), G (green), and B (blue) are sequentially sampled and supplied to corresponding signal lines, the number of terminals for connecting the shift register 404 and the analog switch 405 to each other corresponds to approximately ⅓ of the number of terminals for connecting the analog switch 405 and the signal line of the pixel portion 400 to each other. Accordingly, as compared to the case where the analog switch 405 and the pixel portion 400 are formed over different substrates, the number of terminals used for connecting a substrate which is separately formed can be suppressed when the analog switch 405 and the pixel portion 400 are formed over one substrate. Thus, occurrence probability of defective connection can be suppressed and a yield can be improved.

Note that although the scan line driver circuit 402 in FIG. 16 includes the shift register 406 and the buffer 407, the present invention is not limited thereto. The scan line driver circuit 402 may be formed using only the shift register 406.

Note that the structures of the signal line driver circuit and the scan line driver circuit are not limited to the structure illustrated in FIG. 16, which are merely one mode of the display device.

Figure 17A:
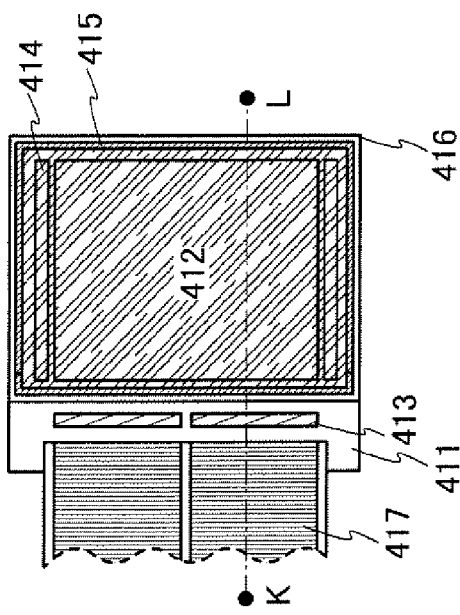
FIGS. 17A and 17B illustrate a display device.
Figure 17B:
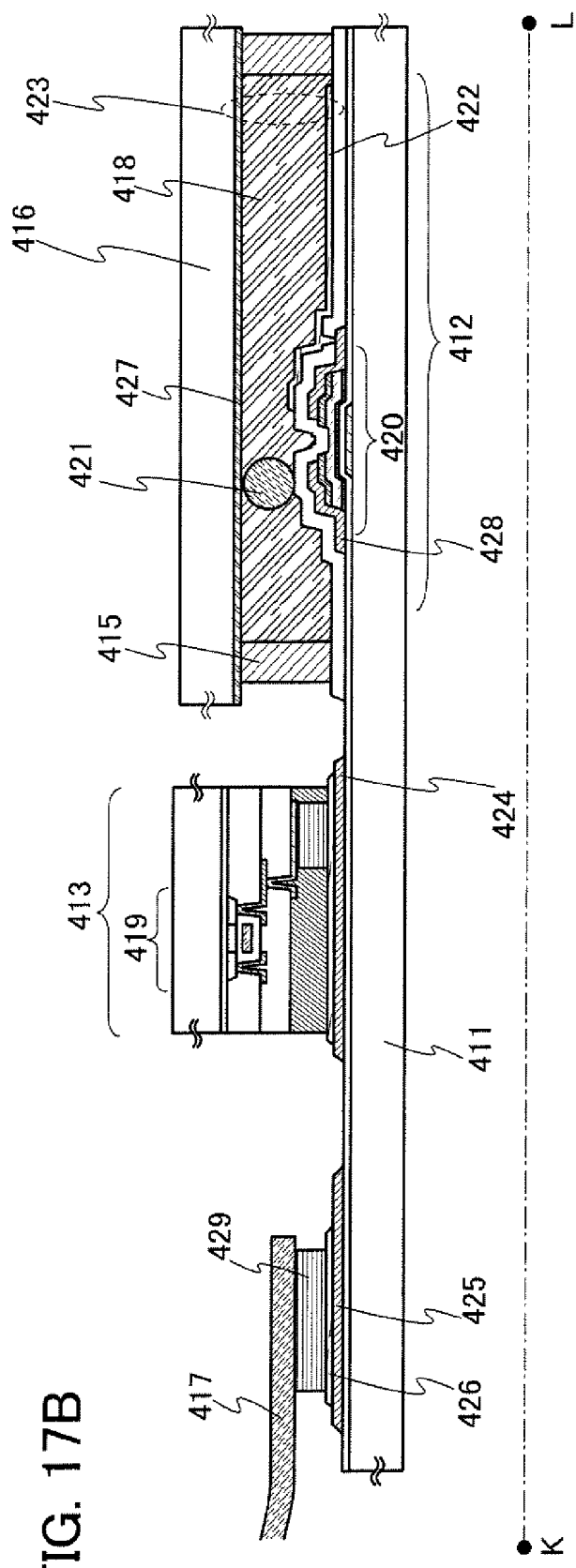
Figure 18A:
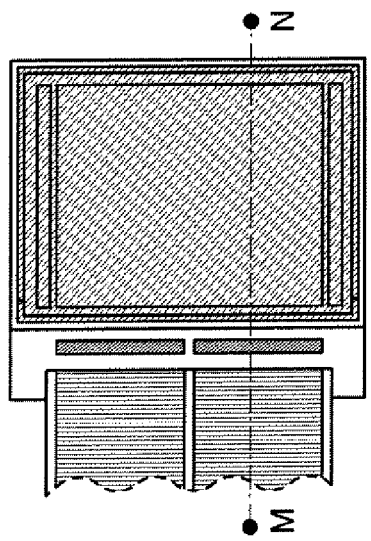
FIGS. 18A and 18B illustrate a display device.
Figure 18B:
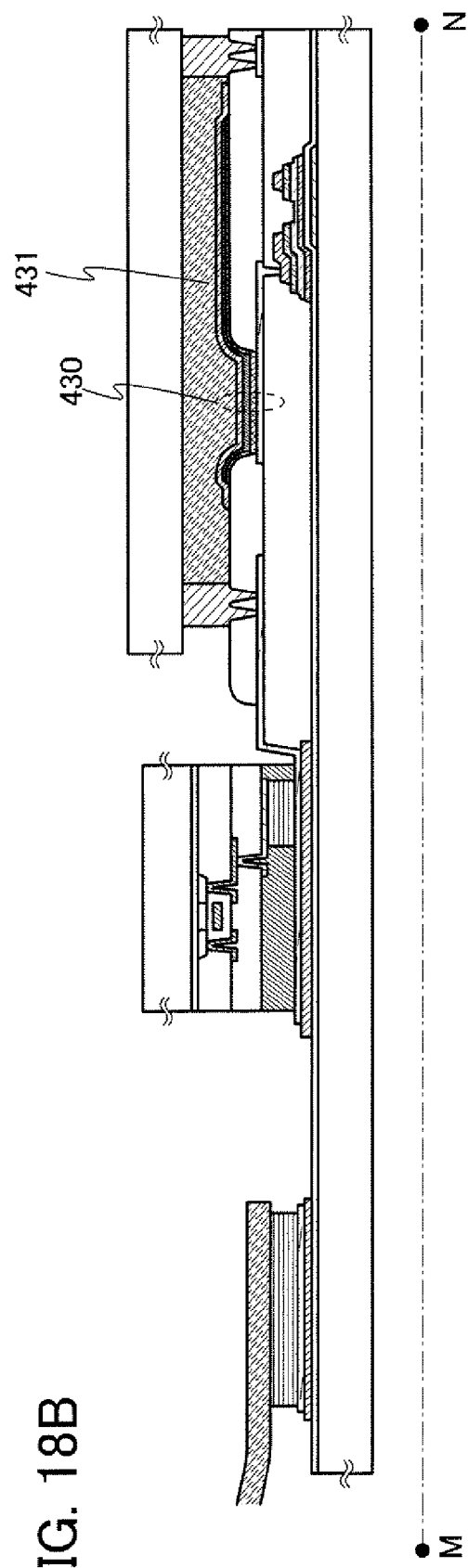

Next, appearance of a liquid crystal display panel and a light-emitting panel each of which is one mode of the display device will be described with reference to FIGS. 17A and 17B and FIGS. 18A and 18B. FIG. 17A is a top view of a panel in which a TFT 420 including a crystalline semiconductor layer and a liquid crystal element 423 that are formed over a first substrate 411 are sealed with a sealant 415 between the first substrate 411 and a second substrate 416. FIG. 17B is a cross-sectional view taken along line K-L in FIG. 17A. FIGS. 18A and 18B illustrate a light-emitting device. Note that in FIGS. 18A and 18B, only portions which are different from FIGS. 17A and 17B are denoted by reference numerals.

The sealant 415 is provided to surround a pixel portion 412 and a scan line driver circuit 414 which are provided over the first substrate 411. Then, the second substrate 416 is provided over the pixel portion 412 and the scan line driver circuit 414. Thus, the pixel portion 412 and the scan line driver circuit 414, together with a liquid crystal layer 418 or a filler 431, are sealed with the first substrate 411, the sealant 415, and the second substrate 416. Then, a signal line driver circuit 413 is mounted on a region over the first substrate 411, which is different from the region surrounded with the sealant 415. Note that the signal line driver circuit 413 is formed with a TFT having a crystalline semiconductor layer formed over a separately prepared substrate. Note that although the case in which the signal line driver circuit 413 including a TFT having a crystalline semiconductor layer is attached to the first substrate 411 is described in this embodiment, a signal line driver circuit is preferably formed with a TFT including a single crystal semiconductor and attached to the first substrate 411. FIGS. 17A and 17B illustrate a TFT 419 formed using a crystalline semiconductor layer, which is included in the signal line driver circuit 413.

The pixel portion 412 provided over the first substrate 411 includes a plurality of TFTs, and in FIG. 17B, a TFT 420 included in the pixel portion 412 is exemplified. Note that in the light-emitting device of this embodiment, the TFT 420 may be a driving transistor, a current control transistor, or an erasing transistor. The TFT 420 corresponds to the TFT including a crystalline semiconductor layer described in Embodiment 1.

A pixel electrode 422 of the liquid crystal element 423 is electrically connected to the TFT 420 through a wiring 428. A counter electrode 427 of the liquid crystal element 423 is formed on the second substrate 416. The liquid crystal element 423 corresponds to a portion where the pixel electrode 422, the counter electrode 427, and the liquid crystal layer 418 overlap with each other.

A pixel electrode included in a light-emitting element 430 is electrically connected to a source or drain electrode of the TFT 420 through a wiring. Then, in this embodiment, a light-transmitting conductive material layer and a common electrode of the light-emitting element 430 are electrically connected to each other. The structure of the light-emitting element 430 is not limited to the structure described in this embodiment. The structure of the light-emitting element 430 can be determined depending on a direction of light taken from the light-emitting element 430, polarity of the TFT 420, or the like.

The first substrate 411 and the second substrate 416 can be formed using glass, metal (e.g., stainless steel), ceramics, plastics, or the like as a material. As plastic, a fiberglass-reinforced plastics (FRP) plate, a polyvinyl fluoride (PVF) film, a polyester film, an acrylic resin film, or the like can be used. Alternatively, a sheet in which aluminum foil is sandwiched by PVF films or polyester films may be used.

Note that a spacer 421 is a bead spacer, and is provided to ensure a certain distance (a cell gap) between the pixel electrode 422 and the counter electrode 427. Further, a spacer (a post spacer) which is obtained by selectively etching an insulating layer may also be used.

Note that a variety of signals (potentials) supplied to the pixel portion 412 and the scan line driver circuit 414, and the signal line driver circuit 413 which is formed separately are supplied from an FPC (flexible printed circuit) 417 through a lead wiring 424 and a lead wiring 425.

In this embodiment, a connection terminal 426 is formed using the same conductive layer as the pixel electrode 422 included in the liquid crystal element 423. Then, the lead wiring 424 and the lead wiring 425 are formed using the same conductive layer as the wiring 428.

The connection terminal 426 is electrically connected to a terminal included in the FPC 417 through an anisotropic conductive layer 429.

Although not illustrated, the liquid crystal display device described in this embodiment includes an alignment film and a polarizing plate, and may also include a color filter, a light-shielding layer, or the like.

As the second substrate located in the direction in which light is extracted from the light-emitting element 430, a light-transmitting substrate is used. In that case, a substrate formed using a light-transmitting material, such as a glass plate, a plastic plate, a polyester film, or an acrylic film, is used. When light is extracted from the light-emitting element 430 in a direction of the first substrate, a light-transmitting substrate is used as the first substrate.

Note that as the filler 431, an inert gas such as nitrogen or Ar, an ultraviolet curable resin, a thermosetting resin, or the like can be used. For example, polyvinyl chloride (PVC), acrylic, polyimide, an epoxy resin, a silicone resin, polyvinyl butyral (PVB), or ethylene vinyl acetate (EVA) can be used. Here, for example, nitrogen is preferably used.

Note that an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element.

Further, a polarizing plate or a circularly polarizing plate may be provided with an anti-reflection layer.

Embodiment 3

In this embodiment, electronic devices in which a display panel or a display device manufactured by the method described in Embodiment 2 is incorporated as a display portion will be described with reference to FIGS. 19A and 19B, FIG. 20, and FIGS. 21A to 21C. As such electronic devices, for example, cameras such as video cameras or digital cameras; head mounted displays (goggle type displays); car navigation systems; projectors; car stereos; personal computers; and portable information terminals (such as mobile computers, mobile phones, and e-book readers) can be given. Examples of the electronic devices are illustrated in FIGS. 19A and 19B.

Figure 19A:
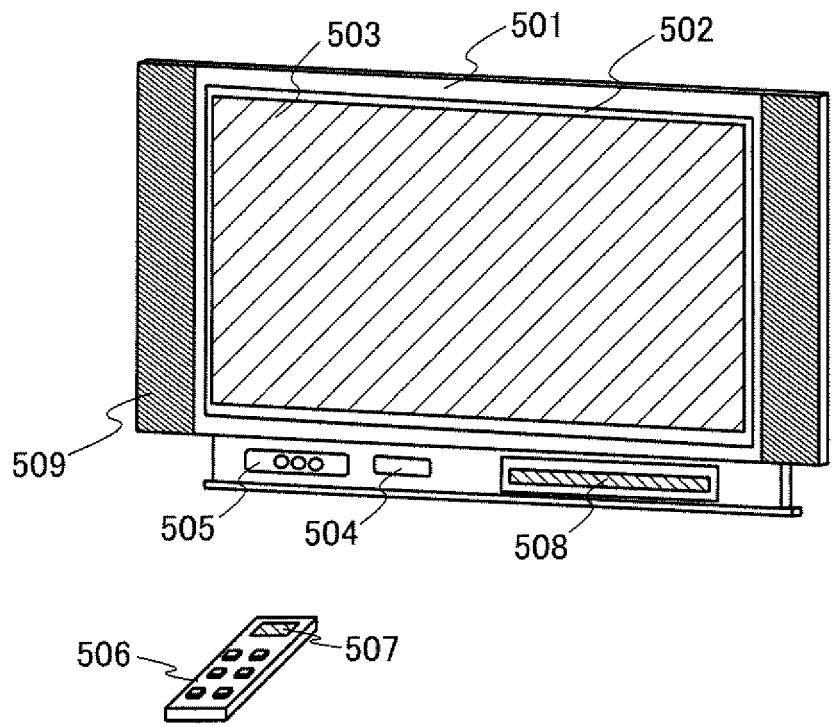
FIGS. 19A and 19B illustrate electronic devices.
Figure 19B:
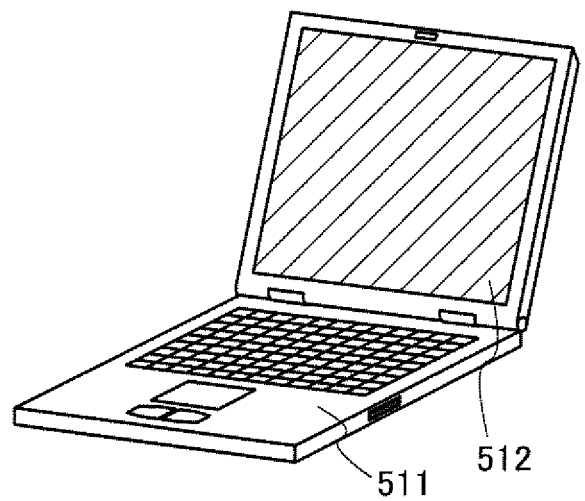

FIG. 19A illustrates a television device. A television device illustrated in FIG. 19A can be completed by incorporating a display panel into a housing. A main screen 503 is formed using the display panel manufactured by the manufacturing method described in Embodiment 2, and a speaker portion 509, operation switches, and the like are provided as its accessory equipment.

As illustrated in FIG. 19A, a display panel 502 manufactured by the manufacturing method described in Embodiment 2 is incorporated into a housing 501, and general TV broadcast can be received by a receiver 505. When the television device is connected to a communication network by wired or wireless connections via a modem 504, one-way (from a sender to a receiver) or two-way (between a sender and a receiver or between receivers) information communication can be performed. Operation of the television device can be performed using switches incorporated into the housing or by a remote control device 506. A display portion 507 which displays output information may be provided for the remote control device 506.

Note that the television device may include a sub-screen 508 formed using a second display panel for displaying channels, volume, and the like, in addition to the main screen 503.

Figure 20:
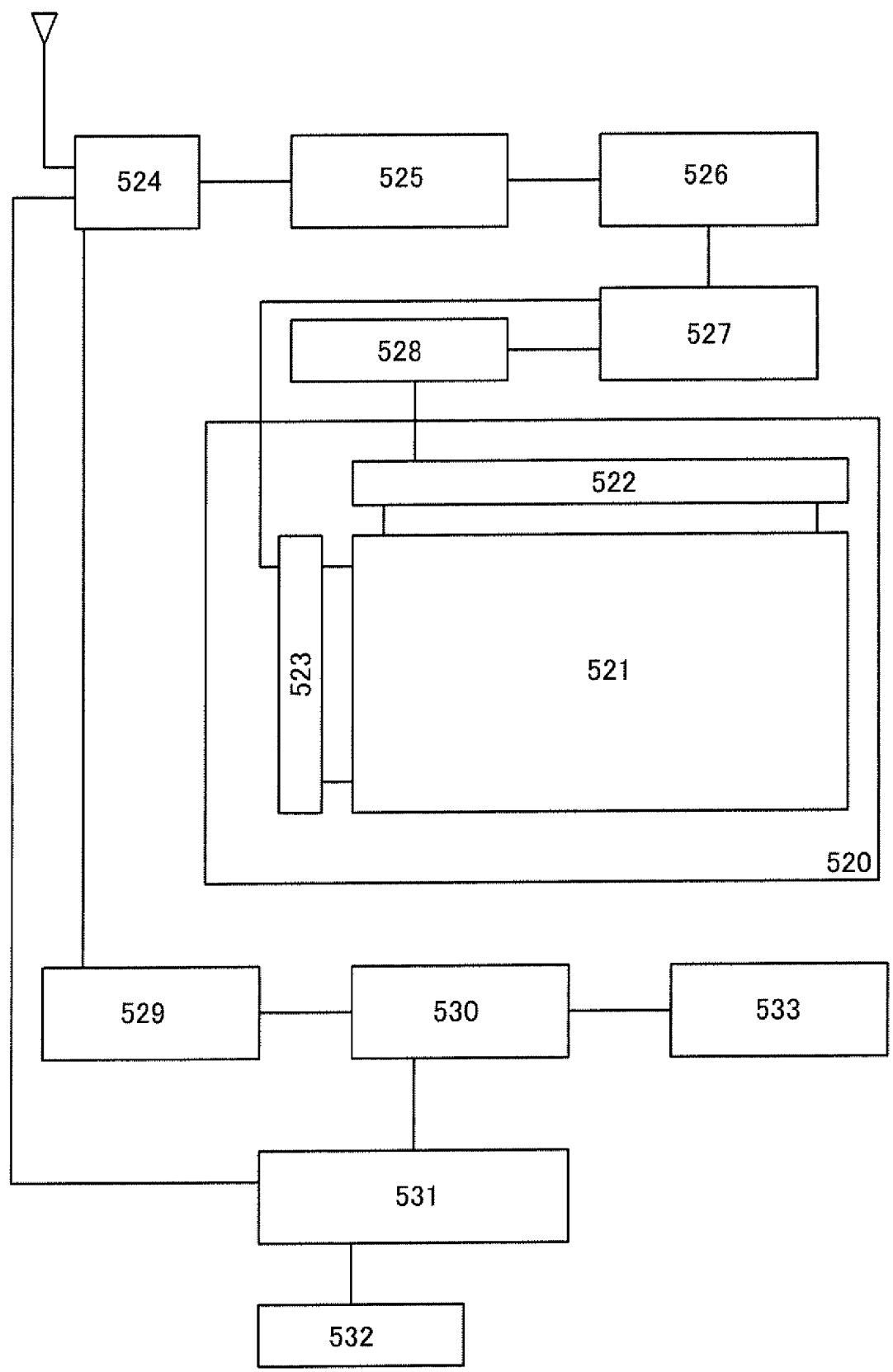
FIG. 20 illustrates an electronic device.

FIG. 20 is a block diagram of a main structure of a television device. A pixel portion 521 is formed in a display panel 520. A signal line driver circuit 522 and a scan line driver circuit 523 may be mounted on the display panel 520 by a COG method.

As structures of other external circuits, a video signal amplifier circuit 525 which amplifies a video signal among signals received by a tuner 524, a video signal processing circuit 526 which converts signals outputted from the video signal amplifier circuit 525 into chrominance signals corresponding to respective colors of red, green, and blue, a control circuit 527 for converting the video signal into a signal which meets input specifications, and the like are provided on the input side of the video signal. The control circuit 527 outputs signals to each of the scan line driver circuit 523 and the signal line driver circuit 522. In the case of digital driving, a signal dividing circuit 528 may be provided on the signal line side and an input digital signal may be divided into integral pieces and supplied.

Among the signals received by the tuner 524, audio signals are transmitted to an audio signal amplifier circuit 529, and an output thereof is supplied to a speaker 533 through an audio signal processing circuit 530. A control circuit 531 receives a control signal on receiving station (receiving frequency) and volume from an input portion 532 and transmits the signals to the tuner 524 and the audio signal processing circuit 530.

Needless to say, the display device which is one mode of the present invention is not limited to the television device and can also be applied to a large-sized display medium such as an information display board at a train station, an airport, and the like, or an advertisement display board on the street, as well as a monitor of a personal computer. Therefore, display quality of these display media can be improved.

When the display panel or display device manufactured by the manufacturing method described in Embodiment 2 is applied to one of or both the main screen 503 and the sub screen 508, display quality of a television device can be increased.

A mobile computer illustrated in FIG. 19B includes a main body 511, a display portion 512, and the like. When the display panel or display device manufactured by the manufacturing method of a display device described in Embodiment 2 is applied to the display portion 512, display quality in a display portion of a computer can be increased.

Figure 21A:
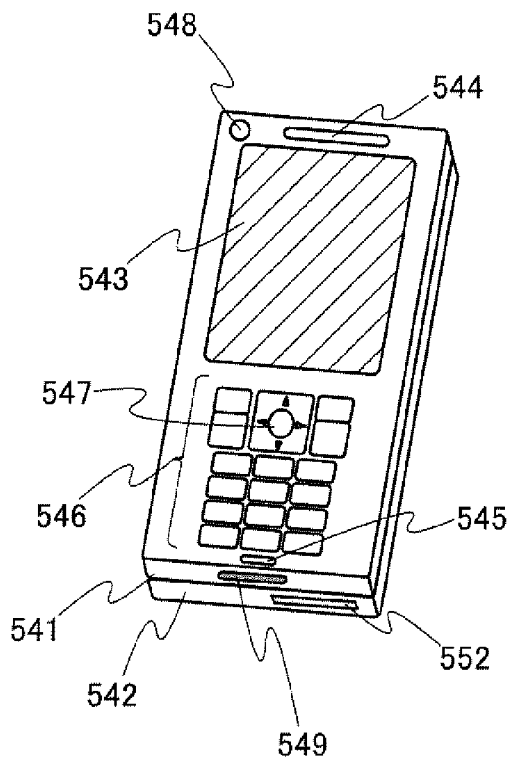
FIGS. 21A to 21C illustrate an electronic device.
Figure 21B:
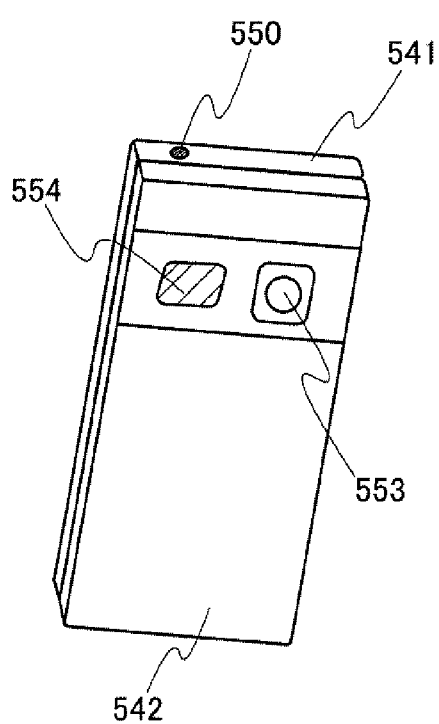
Figure 21C:
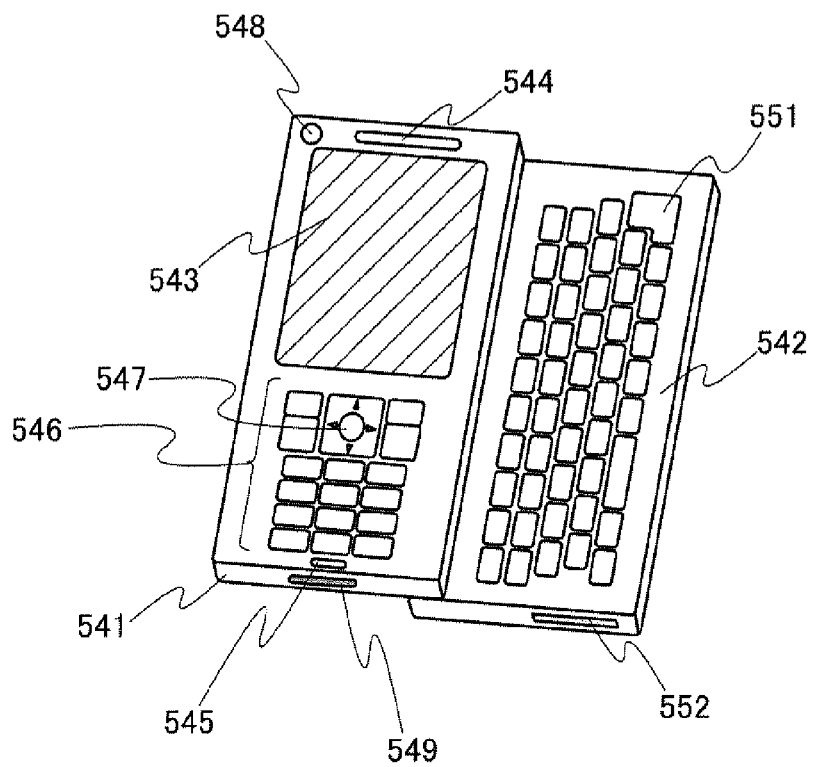

FIGS. 21A to 21C illustrate an example of a cellular phone. FIG. 21A is a front view, FIG. 21B is a rear view, and FIG. 21C is a development view when two housing are slid. A cellular phone illustrated in FIGS. 21A to 21C includes two housings 541 and 542. The cellular phone illustrated in FIGS. 21A to 21C is a so-called smartphone which has both functions of a cellular phone and a portable information terminal and which incorporates a computer, and can process a variety of data processing in addition to voice calls.

The housing 541 includes a display portion 543, a speaker 544, a microphone 545, operation keys 546, a pointing device 547, a front camera lens 548, a jack 549 for an external connection terminal, an earphone terminal 550, and the like, while the housing 542 includes a keyboard 551, an external memory slot 552, a rear camera 553, a light 554, and the like. In addition, an antenna is incorporated in the housing 541.

Note that in addition to the above-described structure, a wireless IC chip, a small size memory device, or the like may be incorporated in the cellular phone illustrated in FIGS. 21A to 21C.

The housings 541 and 542 which overlap with each other (illustrated in FIG. 21A) can be slid and are developed by being slid as illustrated in FIG. 21C. The display panel or display device manufactured by the manufacturing method of a display device described in Embodiment 2 can be incorporated in the display portion 543. Since the display portion 543 and the front camera lens 548 are provided in the same plane, the cellular phone can be used as a videophone. A still image and a moving image can be taken by the rear camera 553 and the light 554 by using the display portion 543 as a viewfinder.

The speaker 544 and the microphone 545 are used, whereby the cellular phone illustrated in FIGS. 21A to 21C can be used as an audio recording device (sound recorder) or an audio reproducing device. With the use of the operation keys 546, operation of incoming and outgoing calls, simple information input for e-mail or the like, scrolling of a screen displayed on the display portion, cursor motion for selecting information to be displayed on the display portion, and the like are possible.

Note that when much information needs to be handled, such as the case of creating documents and using the cellular phone as a portable information terminal, the use of the keyboard 551 is convenient. Further, the housings 541 and 542 which overlap with each other (see FIG. 21A) slide and thus can be developed as illustrated in FIG. 21C. In the case where the cellular phone is used as a portable information terminal, a cursor can be used with smooth operation by using the keyboard 551 and the pointing device 547. The jack 549 for an external connection terminal can be connected to various cables such as an AC adapter and a USB cable, whereby the cellular phone can be charged and can perform data communication with a personal computer or the like. Note that by inserting a recording medium into the external memory slot 552, the cellular phone can deal with storing and moving of a large amount of data.

In the rear surface of the housing 542 (see FIG. 21B), the rear camera 553 and the light 554 are provided, and a still image and a moving image can be taken using the display portion 543 as a viewfinder.

Note that the cellular phone may have an infrared communication function, a USB port, a function of receiving one segment television broadcast, a wireless IC chip, an earphone jack, or the like, in addition to the above-described functions and structures.

Since various electronic devices described in this embodiment can be manufactured by the manufacturing methods of the TFT described in Embodiment 1 and the display device described in Embodiment 2. Thus, an electronic device including a display portion having high display quality can be manufactured without increase of the manufacturing cost.

The present application is based on Japanese Patent Application serial No. 2009-078763 filed with Japan Patent Office on Mar. 27, 2009, the entire contents of which are hereby incorporated by reference.

What is claimed is:

1. A semiconductor device comprising:
a first wiring layer;
a gate insulating layer covering the first wiring layer;
a semiconductor layer over the gate insulating layer, overlapping the first wiring layer, and comprising a channel formation region;
first and second impurity semiconductor layers on the semiconductor layer, the first and second impurity semiconductor layers being configured to be a source region and a drain region; and
second wiring layers over the first and second impurity semiconductor layers;
wherein the semiconductor layer includes a pair of first regions each having a first width along a channel formation region width direction and a second region provided between the pair of first regions and having a second width along the channel formation region width direction, the second width being larger than the first width,
wherein the second wiring layers overlap with at least a portion of the second region, and
wherein each of edges of the first and second impurity semiconductor layers is in direct contact with the semiconductor layer on the first wiring layer.

2. The semiconductor device according to claim 1, wherein an entire bottom surface of the semiconductor layer overlaps with the first wiring layer.

3. The semiconductor device according to claim 1, wherein the semiconductor layer comprises:
a first layer comprising crystalline semiconductor; and
a second layer on the first layer, the second layer including amorphous semiconductor and minute semiconductor crystal grains.

4. The semiconductor device according to claim 1, wherein widths of the second wiring layers on the first and second impurity semiconductor layers along the channel formation region width direction are smaller than the first width.

5. The semiconductor device according to claim 1,
wherein the first regions include third regions and fourth regions,
wherein the first and second impurity semiconductor layers overlap with the third regions,
wherein the first and second impurity semiconductor layers do not overlap with the fourth regions,
wherein the first and second impurity semiconductor layers have third widths along the channel formation region width direction, and
wherein the third widths are smaller than the first width.

6. A semiconductor device comprising:
a first wiring layer;
a gate insulating layer covering the first wiring layer;
a semiconductor layer over the gate insulating layer, overlapping the first wiring layer, and comprising a channel formation region;
first and second impurity semiconductor layers on the semiconductor layer, the first and second impurity semiconductor layers being configured to be a source region and a drain region; and
second wiring layers over the first and second impurity semiconductor layers;
wherein the semiconductor layer includes a pair of first regions each having a first width along a channel formation region width direction and a second region provided between the pair of first regions and having a second width along the channel formation region width direction, the second width being larger than the first width,
wherein the second wiring layers overlap with at least a portion of the second region,
wherein each of edges of the first and second impurity semiconductor layers is in direct contact with the semiconductor layer on the first wiring layer, and
wherein a distance between the source region and the drain region is shorter than a length of the second region.

7. The semiconductor device according to claim 6, wherein the semiconductor layer comprises:
a first layer comprising crystalline semiconductor; and
a second layer on the first layer, the second layer including amorphous semiconductor and minute semiconductor crystal grains.

8. The semiconductor device according to claim 6, wherein an entire bottom surface of the semiconductor layer overlaps with the first wiring layer.

9. The semiconductor device according to claim 6, wherein widths of the second wiring layers on the first and second impurity semiconductor layers along the channel formation region width direction are smaller than the first width.

10. The semiconductor device according to claim 6,
wherein the first regions include third regions and fourth regions,
wherein the first and second impurity semiconductor layers overlap with the third regions,
wherein the first and second impurity semiconductor layers do not overlap with the fourth regions,
wherein the first and second impurity semiconductor layers have third widths along the channel formation region width direction, and
wherein the third widths are smaller than the first width.

11. A display device comprising:
a first wiring layer;
a gate insulating layer covering the first wiring layer;
a semiconductor layer over the gate insulating layer, overlapping the first wiring layer, and comprising a channel formation region;
first and second impurity semiconductor layers on the semiconductor layer, the first and second impurity semiconductor layers being configured to be a source region and a drain region;
second wiring layers over the first and second impurity semiconductor layers;

a pixel electrode layer connected to one of the second wiring layers, wherein the semiconductor layer includes a pair of first regions each having a first width along a channel formation region width direction and a second region provided between the pair of first regions and having a second width along the channel formation region width direction, the second width being larger than the first width, wherein the second wiring layers overlap with at least a portion of the second region, and wherein each of edges of the first and second impurity semiconductor layers is in direct contact with the semiconductor layer on the first wiring layer.

12. The display device according to claim 11, wherein an entire bottom surface of the semiconductor layer overlaps with the first wiring layer.

13. The display device according to claim 11, wherein the semiconductor layer comprises:

a first layer comprising crystalline semiconductor; and a second layer on the first layer, the second layer including amorphous semiconductor and minute semiconductor crystal grains.

14. The display device according to claim 11, wherein widths of the second wiring layers on the first and second impurity semiconductor layers along the channel formation region width direction are smaller than the first width.

15. The display device according to claim 11, wherein the first regions include third regions and fourth regions, wherein the first and second impurity semiconductor layers overlap with the third regions, wherein the first and second impurity semiconductor layers do not overlap with the fourth regions, wherein the first and second impurity semiconductor layers have third widths along the channel formation region width direction, and wherein the third widths are smaller than the first width.

16. A display device comprising:

a first wiring layer;

a gate insulating layer covering the first wiring layer;

a semiconductor layer over the gate insulating layer, overlapping the first wiring layer, and comprising a channel formation region;

first and second impurity semiconductor layers on the semiconductor layer, the first and second impurity semiconductor layers being configured to be a source region and a drain region;

second wiring layers over the first and second impurity semiconductor layers; and a pixel electrode layer connected to one of the second wiring layers, wherein the semiconductor layer includes a pair of first regions each having a first width along a channel formation region width direction and a second region provided between the pair of first regions and having a second width along the channel formation region width direction, the second width being larger than the first width, wherein the second wiring layers overlap with at least a portion of the second region, wherein a distance between the source region and the drain region is shorter than a length of the second region, and wherein each of edges of the first and second impurity semiconductor layers is in direct contact with the semiconductor layer on the first wiring layer.

17. The display device according to claim 16, wherein an entire bottom surface of the semiconductor layer overlaps with the first wiring layer.

18. The display device according to claim 16, wherein the semiconductor layer comprises:

a first layer comprising crystalline semiconductor; and a second layer on the first layer, the second layer including amorphous semiconductor and minute semiconductor crystal grains.

19. The display device according to claim 16, wherein widths of the second wiring layers on the first and second impurity semiconductor layers along the channel formation region width direction are smaller than the first width.

20. The display device according to claim 16, wherein the first regions include third regions and fourth regions, wherein the first and second impurity semiconductor layers overlap with the third regions, wherein the first and second impurity semiconductor layers do not overlap with the fourth regions, wherein the first and second impurity semiconductor layers have third widths along the channel formation region width direction, and wherein the third widths are smaller than the first width.

* * * * *